US011003499B1

(12) United States Patent
Abretske et al.

(10) Patent No.: US 11,003,499 B1
(45) Date of Patent: May 11, 2021

(54) RESOURCE ALLOCATION BASED ON AGENT BEHAVIOR IN A SIMULATION ENVIRONMENT

(71) Applicant: Amazon Technologies, Inc., Reno, NV (US)

(72) Inventors: Daniel A. Abretske, Irvine, CA (US); Justin Boswell, Rancho Santa Margarita, CA (US)

(73) Assignee: AMAZON TECHNOLOGIES, INC., Seattle, WA (US)

( * ) Notice: Subject to any disclaimer, the term of this patent is extended or adjusted under 35 U.S.C. 154(b) by 36 days.

(21) Appl. No.: 15/623,189

(22) Filed: Jun. 14, 2017

(51) Int. Cl.
G06F 9/46 (2006.01)
G06F 9/50 (2006.01)
G06F 30/20 (2020.01)

(52) U.S. Cl.
CPC .............. *G06F 9/505* (2013.01); *G06F 30/20* (2020.01)

(58) Field of Classification Search
CPC .............................. G06F 9/505; G06F 17/5009
See application file for complete search history.

(56) References Cited

U.S. PATENT DOCUMENTS

| 7,293,235 B1* | 11/2007 | Powers .................... G06T 7/20 463/1 |
| 9,495,211 B1* | 11/2016 | Helstroom ................ G06F 9/50 |
| 2005/0114862 A1* | 5/2005 | Bisdikian .............. G06F 9/5072 718/105 |
| 2007/0232400 A1* | 10/2007 | Takahashi ............... A63F 13/12 463/42 |
| 2009/0251469 A1* | 10/2009 | Cohen ..................... G06T 13/20 345/473 |
| 2009/0275414 A1* | 11/2009 | Lee ......................... A63F 13/12 463/42 |
| 2010/0079446 A1* | 4/2010 | Betzler ................... A63F 13/56 345/419 |
| 2011/0029981 A1* | 2/2011 | Jaisinghani ............ H04L 41/12 718/104 |
| 2013/0072296 A1* | 3/2013 | Miyazaki ................ A63F 13/10 463/31 |

(Continued)

OTHER PUBLICATIONS

Kavalionak et al. "Integrating peer-to-peer and cloud computing for massively multiuser online games". (Year: 2013).*

(Continued)

*Primary Examiner* — Adam Lee
(74) *Attorney, Agent, or Firm* — Hogan Lovells US LLP

(57) ABSTRACT

The present disclosure provides for predictively allocating computing resources based on movement of a simulation agent through a simulation environment, such as in a video game. In order to support the movement of the simulation agent, computing resources may be allocated in various ways. For example, one option may be to transfer data assets associated with the simulation agent from the first computing resource to the second computing resource. Another option may be leave the data assets at the first computing resource and transfer authority over at least a portion of the second region from the second computing resource to the first computing resource. In various embodiments, the way in which the computing resources are allocated may be determined based on various factors, such as resource costs, so that the movement of the simulation agent can be supported with optimal system efficiency.

17 Claims, 10 Drawing Sheets

(56) References Cited

U.S. PATENT DOCUMENTS

| | | | | |
|---|---|---|---|---|
| 2013/0179895 A1* | 7/2013 | Calder | ................. | G06F 9/5077 718/104 |
| 2013/0203496 A1* | 8/2013 | Kruglick | .................. | A63F 9/24 463/42 |
| 2013/0253675 A1* | 9/2013 | Kurabayashi | ........... | A63F 13/12 700/91 |
| 2014/0101666 A1* | 4/2014 | Jackson | ................ | G06F 9/5038 718/104 |
| 2014/0221070 A1* | 8/2014 | Lund | ................... | G07F 17/3293 463/13 |
| 2014/0228108 A1* | 8/2014 | Bruno, Jr. | ............... | A63F 13/35 463/29 |
| 2014/0365412 A1* | 12/2014 | Mizrachi | ............... | A63F 13/422 706/14 |
| 2015/0381425 A1* | 12/2015 | Kansal | ............... | H04L 41/0896 709/224 |

OTHER PUBLICATIONS

Gil et al. "Architecting Scalability for Massively Multiplayer Online Gaming Experiences". Proceedings of DiGRA Conference: Changing Views Worlds in Play. (Year: 2005).*

Gorlatch et al. "Towards a Scalable Real-Time Cyberinfrastructure for Online Computer Games". 15th Internation Conference on Parallel and Distributed Systems. (Year: 2009).*

Nae et al. "Cost-Efficient Hosting and Load Balancing of Massively Multiplayer Online Games". 11th IEEE/ACM International Conference on Grid Computing. (Year: 2010).*

Nae et al. "A New Business Model for Massively Multiplayer Online Games". ICPE'11 ACM. (Year: 2011).*

Nae et al. "Dynamic Resource Provisioning in Massively Multiplayer Online Games". IEEE Transactions on Parallel and Distributed Systems. vol. 22, No. 3. (Year: 2011).*

Prodan et al. "Prediction-based real-time resource provisioning for massively multiplayer online games". Future Generation Computer Systems 25. (Year: 2009).*

Quax et al. "Empirical Evaluation of the Efficiency of Spatial Subdivision Schemes and Load Balancing Strategies for Networked Games". IEEE. (Year: 2011).*

* cited by examiner

RESOURCE ALLOCATION BASED ON AGENT BEHAVIOR IN A SIMULATION ENVIRONMENT

BACKGROUND

Software applications such as video games have become increasingly sophisticated, with intricate graphics, networked gameplay, and other advanced features. However, such applications require large amounts of data and computing resources. Game data or control of various aspects of a game may be distributed across a number of game servers and/or player devices. At certain points during gameplay, certain data may be transferred between game servers, between game servers and player devices, or even between player devices in order to render or enable certain aspects of the game. However, it may take an amount of time to transfer and load data, known as latency. Latency can cause delays in gameplay, incomplete rendering of game elements, communication lag, and other such disruptions, all of which contribute to a suboptimal gaming experience.

BRIEF DESCRIPTION OF THE DRAWINGS

Various embodiments in accordance with the present disclosure will be described with reference to the drawings, in which.

DETAILED DESCRIPTION

Figure 1:
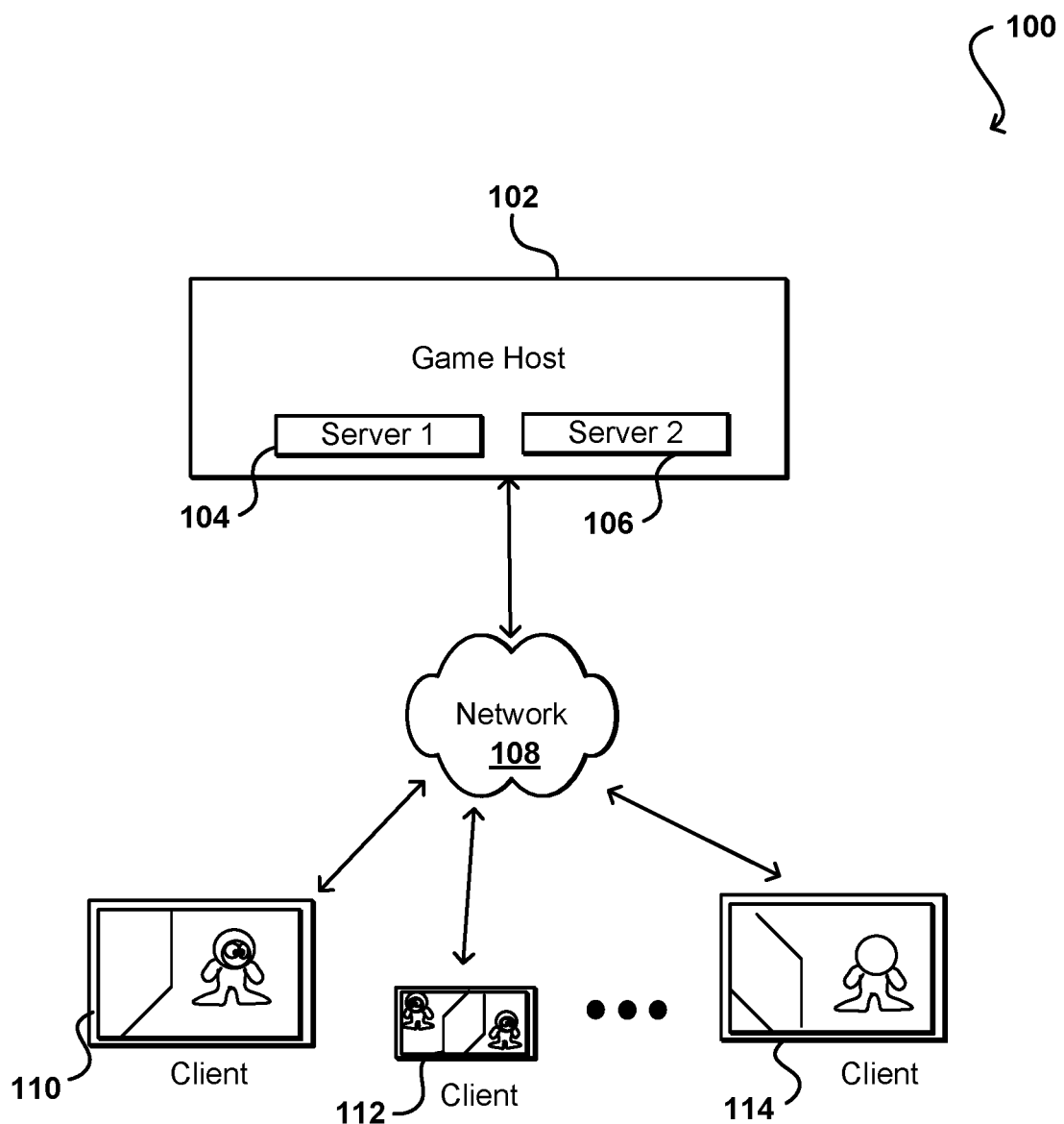
FIG. 1 illustrates an example system implementation with predictive resource allocation, in accordance with various embodiments.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Systems and methods in accordance with various embodiments of the present disclosure overcome one or more of the aforementioned and other deficiencies experienced in resource management such as data loading and device initialization for applications. Specifically, the present disclosure provides for predictive allocation of computing resource, thereby reducing various latency issues and increasing computing efficiency of the system. In accordance with various embodiments, a multi-tenant resource provider, such as a cloud computing platform, provides an environment and tools that can be utilized to build and/or host applications such as games, websites, mobile apps, and the like. It should be noted that although various embodiments described herein reference a gaming environment that includes gaming applications, the techniques described herein can readily be applied to various other types of applications and/or environments for those applications. An application hosted by the resource provider may be developed and/or managed by a content provider, which may be the resource provider, a third-party application provider, or other such entity. The application can be accessed or used by a plurality of end users.

Specifically, in an embodiment, a simulation application, such as a video game, may be hosted in the resource provider environment. The simulation application may include various simulation agents represented as data assets stored in the resource provider environment, and simulation environments represented as a spatial data structure. Simulation agents may include, for example, any type of characters or objects within the simulation world such as animals, spacecrafts, objects, characters, etc, that may move around within the simulation world. In a gaming application, this may include characters and objects controlled by the player or characters and objects in the game environment and programmed to move independently of any player control. Data assets may refer to computer-readable code used to render the simulation agent and any related aspects of the simulation agent, including metadata, and how the simulation agent may interact with the game world. For example, a simulation agent may be a spaceship and the corresponding data asset may include code for rendering the graphic elements of the spaceship, physical data such as weight and dimensions, definitions for how the spaceship flies through the game world, and various other functions and interactions associated with the spaceship. The simulation environment may refer to the setting, such as a world or space in which the simulation takes place and through which a simulation agent can travel. The simulation environment may include a 2D or 3D rendering of land, ocean, sky space or any other type of fictional or non-fictional environment. In a gaming application, the simulation environment may include a for example, a simulated outer space environment, a city environment, a nature environment, among many diverse others.

These data assets may be stored on or utilized by one or more computing resource. Computing resources may refer to any physical or virtual computing related device such as, servers, databases, memory, processors, sensors, communications devices, networked devices, among others). During gameplay, the data assets may be transferred from one resource to another in order to be accessed. For example, in some embodiments, the simulation environment may be represented in data form using a spatial representation such as a spatial data structure. A spatial data structure may be any type of data structure for representing positions of elements in a geometric space such as a plane or volume. Examples of spatial data structures include quadtrees, octrees, r-tree, r+trees, kd-trees, binary space partitioning structures, among many others. In various embodiments, different computing resources control different regions of the simulation environment, the boundaries of which are defined through the spatial data structure. The location of a simulation agent in the simulation environment may be represented as a position within the spatial data structure. Thus, as the simulation agent moves about the simulation environment, control of the simulation agent may be transferred between the different computing resources accordingly.

A trigger condition may occur in the simulation application that may be indicative of an upcoming game event. The trigger condition can be any condition, event, state, or user action in the simulation application that may be associated or correlated with the future occurrence of one or more events. For example, a trigger condition may be a movement behavior of a simulation agent, which may refer to a certain manner in which the simulation agent is moving through the simulation environment or as represented in the spatial data structure. A game event may include a simulation agent moving from a region controlled by a first computing device to a region controlled by a second computing device. Thus, a certain movement behavior of the simulation agent may indicate that the simulation agent will move between the regions within a certain amount of time. In order to support the movement of the simulation agent between a first region controlled by a first computing resource and a second region controlled by a second computing resource, the computing resources may be allocated in various ways. For example, one option may be to transfer data assets associated with the simulation agent from the first computing resource to the second computing resource. Another option may be leave the data assets at the first computing resource and transfer authority over at least a portion of the second region from the second computing resource to the first computing resource. In various embodiments, the way in which the computing resources are allocated may be determined based on various factors, such as resource costs, so that the movement of the simulation agent can be supported with optimal system efficiency.

Allocation of resources may include transferring data between computing resources loading data at a computing resource, transferring authority of various simulation agents or simulation environment regions between computing resource, activating or waking a computing resource, deactivating or sleeping a device, routing communications to or from a computing resource, among others.

In some embodiments, the movement behavior is based at least in part on a set of simulation definitions that define the movement of the simulation agent through the simulation environment under certain conditions. For example, the set of simulation definitions may include various rules of physics as defined within the simulation application, which may give rise to certain movement behaviors of a simulation agent such as velocity, speed, travel trajectory, among others. Some game conditions that may additionally affect such movement behavior may include designated physical parameters of the simulation agent such as weight, mass, dimensions, among other characteristics. In some embodiments, the movement behavior may also include a predetermined flight path of the simulation agent, a present position of the simulation agent, or a previous position of the simulation agent. Conditions may also include player controlled aspects, such as driven speed and direction of the simulation agent, applied load, among others. The set of simulation definitions and certain conditions may define a future time and location of the simulation agent in the simulation environment, the location associated with a different computing resource and the time being a time at which the resource is to execute a function utilizing the data asset associated with the simulation agent.

The technological innovation of the present disclosure reduces the effects of system latency by hiding at least a portion of the latency in performing these tasks, among others, such that the latency experienced by the users is decreased or eliminated, resulting in a more seamless gaming experience. Additionally, the present disclosure provides means of intelligently allocating resources in various ways to perform such tasks with optimal system efficiency. Latency and computing efficiency is a technological hurdle that is application independent and native to computing technology. Thus, among other reasons, the present solution represents advancements in computing technology.

FIG. 1 illustrates an example system implementation 100 utilizing predictive resource allocation in accordance with various embodiments. In this example, for a gaming application, a game host 102 can execute the gaming application utilizing one or more game servers 104, 106 or at least manage game state for instances of the game executing on various client devices 110, 112, 114. Client devices 110, 112, 114 include devices through which a player can play or otherwise interact with the game, and include at least one form of input such as a keyboard or controller, and at least one form of output such as a display. The client devices 110, 112, 114 can include specific gaming devices, such as gaming consoles or handheld consoles, or other computing devices such as smart phones, tablet computers, wearable computers (e.g., smart glasses or watches), desktop or notebook computers, and the like. The client devices 110, 112, 114 can communicate with the gaming server 102 over at least one network 108, such as the Internet, a cellular network, a local area network (LAN), an Ethernet, Wi-Fi, a dedicated gaming network, or a peer-to-peer network, among other such options, such that the game host 102 can communicate with and control various aspects of gameplay on the client devices 110, 112, 114, and the client devices 110, 112, 114 can interact with the game host 102 and in some embodiments, each other.

During gameplay, various game events may occur in which data may need to be loaded by or transferred to a destination device, such as any of the game servers 104, 106 and client devices 110, 112, 114. Data may be transferred or provided between the game servers 104, 106, between a game server 104 and a client device 110, or between client devices 110, 112. In an embodiment, game servers 104, 106 may control or serve data for different aspects of the game. Such game data and control can be distributed across the game servers 104, 106 in according to various schemes. For example, first server 104 may control gameplay for a first region of a world within the game and sever two 106 may control gameplay for a second region of the world within the game. A simulation agent or other game element located in the first region of the game world may be controlled or rendered by the first server and a simulation agent located in the second region of the game world may be controlled or rendered by the second server 106. In some embodiments, the simulation agent may move about the game world, and cross from region boundaries, such as from the first region to the second region. When this type of game event occurs, a data asset representing the simulation agent (i.e. the data from which the simulation agent is rendered) may be transferred from the first server 104 to the second server 106 in order to render to simulation agent in the second region of the game world.

In another example, game data or control may be distributed across the servers 104, 106 based on game events or levels. A game level may refer to a game stage or predefined portion of gameplay, which may include a different game world with different game elements and/or simulation agents that need to be loaded. For example, first server 104 may control and/or render a first level of the game and second server 106 may control or render a second level of the game. Thus, a data asset representing a player playing the first level may be accessed and/or loaded by the first server, and when the player finishes the first level and begins the second level, the data asset representing the player is transferred to the second server 106 or otherwise accessed or loaded by the second server 106. In a similar example, first server 104 may control gameplay for players in a first geographic region and second server 106 may control gameplay for players in a second geographic region.

The client devices 110, 112, 114 may also have some game data stored in one or more levels memory that may be accessed or loaded as various points during gameplay to render certain aspects of the game. For example, client device 110 may have a data asset representing a simulation agent, such as a spaceship, stored in memory. Thus, during gameplay, if a spaceship is to fly into view of the player, then the client device 110 may be invoked by the game host 102 to load the spaceship data asset to render the spaceship. In some examples, the client device 110 may not have the data asset already stored in memory and the data asset may be provided to the client device 110 by the game host. In some embodiments, certain data may also be transferred from client devices 110, 112, 114 to one or more game servers 104, 106, such as when a player enters a new game level or region with the game world.

In the above examples, data is loaded by, transferred to, or otherwise provided to a destination device, which takes a certain amount of time to complete, also known as latency. In addition to data loading, latency may also be present when the destination device is otherwise initialized, such as when the device is activated to a wake state from a sleep state. The present disclosure provides systems and techniques for hiding at least a portion of the latency involved in performing these tasks, among others, by predictively initiating the destination device before the occurrence of a game event involving use of the destination device such that by the time the game event occurs, the destination device will be initialized, and at least a portion of the latency period will have passed. The present systems and techniques are able to hide system latency such that the latency experienced by the player is decreased or eliminated, resulting in a more seamless and gaming experience.

Figure 2:
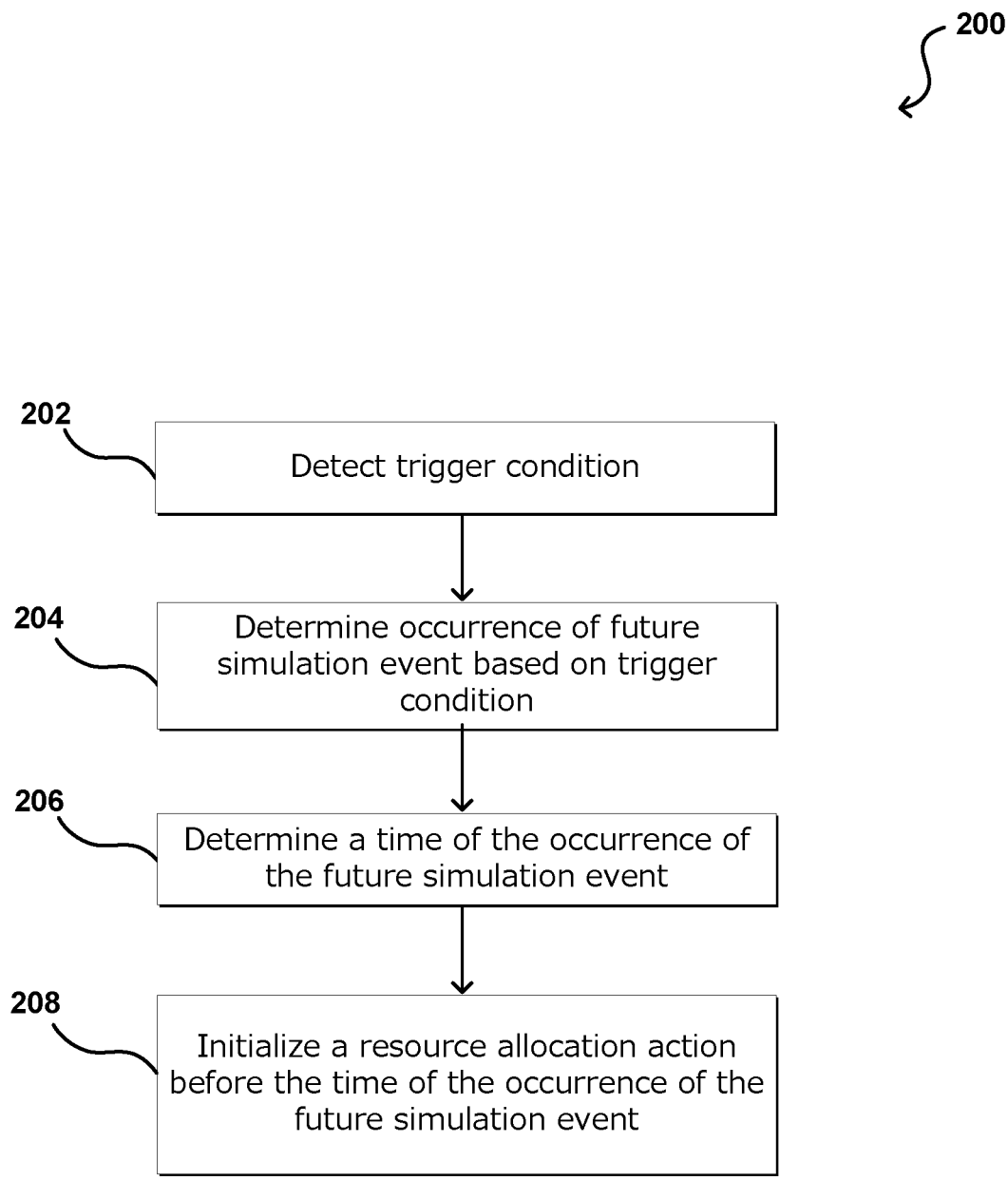
FIG. 2 is a flowchart illustrating a general predictive resource allocation process, in accordance with various embodiments.

FIG. 2 is a flowchart illustrating a general predictive resource allocation process 200, in accordance with various embodiments. In an embodiment, the process 200 may be executed by the game host 102 of FIG. 1. It should be understood that, for any process discussed herein, there can be additional, fewer, or alternative steps performed in similar or alternative orders, or in parallel, within the scope of the various embodiments unless otherwise stated. In this example, a trigger condition may be detected during user interaction with a simulation application such as a video game (202). The trigger condition may be indicative of a future simulation event in which a certain data asset may be used at a computing resource. The trigger condition can be any condition, event, state, or user action in the simulation application that may be associated or correlated with the future occurrence of one or more simulation events. In some embodiments, the trigger condition may include a movement behavior of a simulation agent represented in a spatial data structure of a simulation environment operating in a service provider environment, the simulation agent associated with a data asset and the service provider environment communicative with a plurality of computing resources available over a network. Computing resources may refer to any physical or virtual computing related device such as servers, databases, memory, processors, sensors, communications devices, networked devices, among others.

Simulation agents may include, for example, any type of characters or objects within the simulation world such as animals, spacecrafts, objects, characters, etc, that may move around within the simulation world. In a gaming application, this may include characters and objects controlled by the player or characters and objects that are programmed to move independently of any player control. The simulation environment may refer to the setting, such as a world or space in which the simulation takes place and through which a simulation agent can travel. The simulation environment may include a 2D or 3D rendering of land, ocean, sky space or any other type of fictional or non-fictional environment. In a gaming application, the simulation environment may include a for example, a simulated outer space environment, a city environment, a nature environment, among many diverse others. The movement behavior may include a velocity or trajectory with which the simulation agent is moving in the spatial data structure, a predetermined flight path of the simulation agent, a present position of the simulation agent, or a previous position of the simulation agent. In some embodiments the trigger condition may include player action stage of game progress.

One or more future simulation events may be determined based at least in part of the trigger condition (204). The simulation event may be any type of situation within the simulation application that involves a certain action at a computing resource, such as loading data, receiving data, accessing data, waking, assuming control or authority, receiving communication, among others. The amount of time between the occurrence of the trigger condition and the game event may be determined (206). For example, the time may be known, calculated, or estimated. A resource allocation action associated with the future simulation event is initialized before the determined time of the game event (206). This may include various actions including, transferring a data asset, receiving a data asset, loading a data asset, transferring authority of various game elements or aspects of gameplay, activation or waking a device, deactivation or sleeping a device, routing communications to, through, or from a device, or otherwise initializing the device for the resource event before the simulation event actually occurs. Thus, by the time the simulation event occurs, experienced latency attributed to data loading or device initialization may be reduced or eliminated.

Initializing the resource allocation 208 may include allocating a second set of computing resources to support a movement behavior of a simulation agent based, at least in part, on a performance criteria of the movement behavior. In various embodiments, the second set of computing resources includes either additional resources to a first set of resources or a second set of resources different from the first set based, at least in part, on a cost of allocating the second set of computing resources. The movement behavior may then be performed using the second set of computing resources. The first set of resources may be a set of resource utilized control a first region of the simulation environment in which the simulation agent was located before the game event. The second set of computing resources may be a set of resources utilized to control a second region of the simulation environment in which the simulation agent is located after the game event. Thus, to support the simulation agent being located in the second region, an additional resource may be allocated and used alongside the first set of resources, or a different set of resources may be allocated. For example, one option may be to transfer data assets associated with the simulation agent from the first computing resource to the second computing resource. Another option may be leave the data assets at the first computing resource and transfer authority over at least a portion of the second region from the second computing resource to the first computing resource.

In various embodiments, the way in which the computing resources are allocated may be determined based on various factors, such as resource costs, so that the movement of the simulation agent can be supported with optimal system efficiency. For example, a cost associated with allocation of the additional resources and first set of resources may be determined, and a second cost associated with allocation of a second cost associated with the second set of resources different from the first set may be determined, and the resource allocation option with the least cost may be selected. Example costs include at least one of computation time, memory, load, and bandwidth, among others.

In various embodiments, the resource allocation (i.e., the second set of computing resources), may be determined based on a server load associated with allocation of the second set of computing resources. Specifically, if a server can support the load associated with the resource allocation, then the server may be allocated to accept the load. This may include expanding the authority of the server to support additional regions of the simulation environment associated with the movement behavior of the simulation agent.

In various embodiments, the movement behaviors of a group of simulation agents may be determined, in which the simulation agents are predicted to move from a first region controlled by a first resource to a second region controlled by a second resource. In order to support the movement of at least a portion of this group of agents, authority over the second region of the spatial representation associated may be transferred from the second resource to the first resource so that data transfer may be minimized. In some embodiments, data assets associated with a second portion of the group of simulation agents may be transferred from the first resource to the second resource, for example if these agents fall outside of the region of authority transferred to the first resource.

In some embodiments, such as in a gaming application, the trigger condition may be associated with a probability of the occurrence of the game event. In one example, the trigger condition may indicate that the game event will occur, in which case the probability of occurrence of the game event is 100%. In another example, the game event may or may not occur, and thus have a probability of occurrence below 100%, and data loading or device initialization is invoked if the probability of the occurrence of the game event given the trigger condition is above a certain threshold. The probability of the occurrence of game event associated with the trigger condition may be determined based at least in part on a predetermined gameplay program, past game play statistics, or a likelihood of the occurrence of the future game event given the occurrence of the trigger condition. Past game play statistics may include the player's past behavior patterns or behavior statistics of other game players. In either case, the occurrence of the trigger condition may be used to predict the upcoming game event. In an embodiment, the amount of time to completely load the data asset or initialize the device is also known or estimated, and the data loading or device initialization can be timed such that the data loading or device initialization is completed before the game event occurs. In some embodiments a data asset may be transferred from a source device to the destination device. Data may be transferred between two game servers, between a game server and a client device, or between two client devices.

Figure 3A:
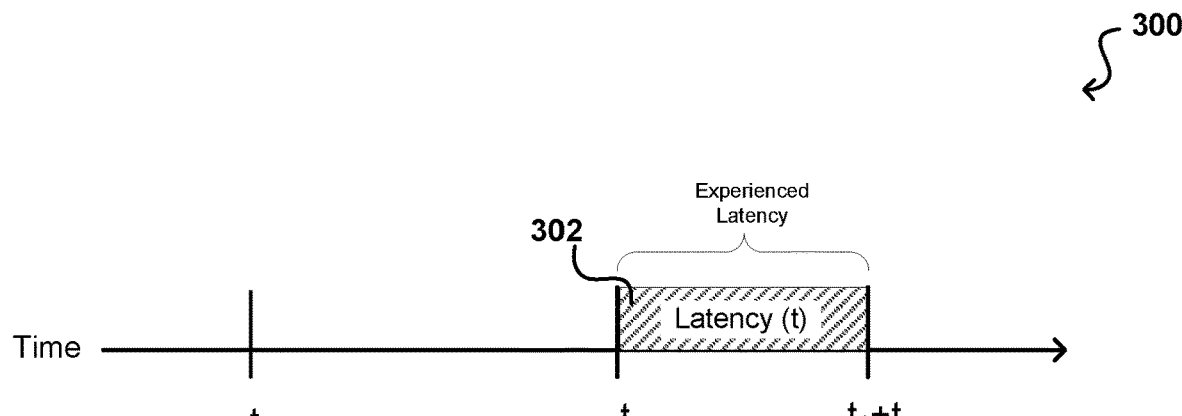
FIG. 3A illustrates latency effects without the predictive resource allocation techniques of the present disclosure.
Figure 3B:
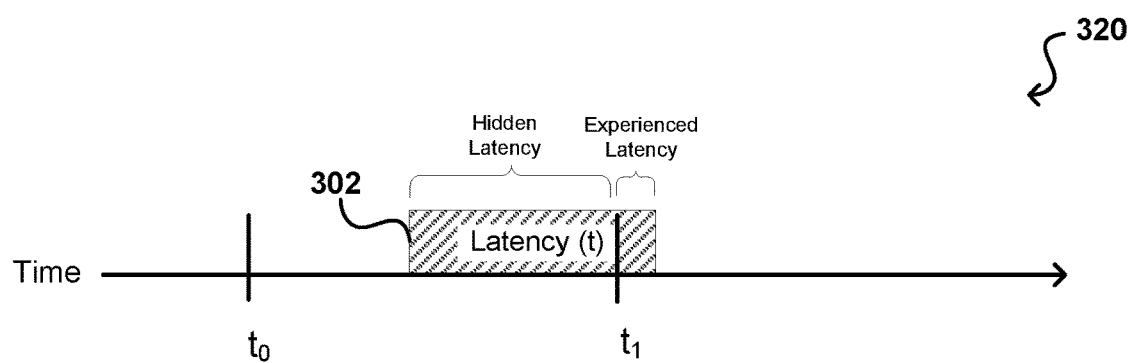
FIG. 3B illustrates latency effects under an embodiment the predictive resource allocation techniques of the present disclosure.
Figure 3C:
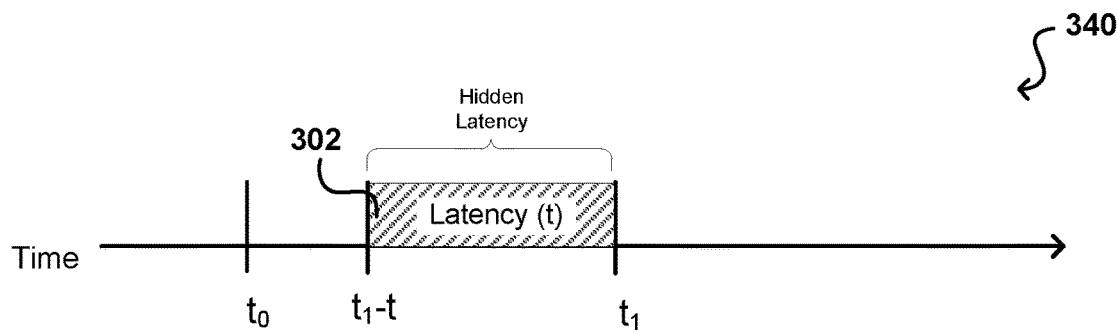
FIG. 3C illustrates latency effects under another embodiment the predictive resource allocation techniques of the present disclosure.
Figure 3D:
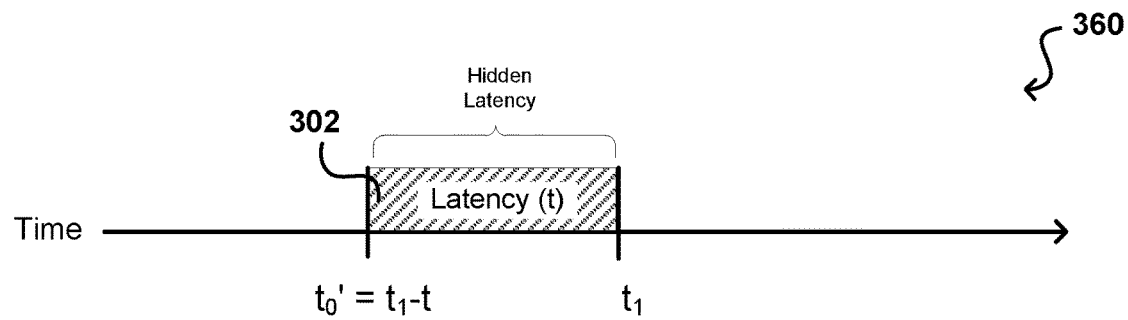
FIG. 3D illustrates latency effects under another embodiment the predictive resource allocation techniques of the present disclosure.

FIGS. 3A-3D are timelines illustrating latency effects under various conditions. Specifically, FIG. 3A illustrates latency effects without the predictive device initialization techniques of the present disclosure, and FIGS. 3B-3D illustrate latency effects under different embodiments of the predictive device initialization techniques. Device initialization may refer to any action performed to facilitate the device's ability to carry out the functions associated with the game event. Examples of device initialization may include loading data, transferring data, transferring or taking over authority of various game elements or aspects of gameplay, activating or waking a device, deactivating or sleeping a device, routing communications to, through, or from the device. Referring to FIG. 3A, timeline 300 illustrates a situation that does not employ the predictive device initialization techniques of the present disclosure, in which a destination device is initialized at time of occurrence of a game event ($t_1$) rather than predictively based on a trigger event ($t_0$). Thus, a latency period (t) 302 for initializing the destination device beings at the time of the occurrence of the game event ($t_1$), and the destination device is not fully initialized and operable as needed for the game event until ($t_1+t$). This results in the latency period (t) being fully experienced by the player.

FIG. 3B includes a timeline 320 illustrating an embodiment of the predictive device initialization techniques of the present disclosure, such as that described above with respect to FIG. 2. Upon the occurrence of the trigger event ($t_0$), the destination device is predictively initialized at some time before the occurrence of the game event ($t_1$), thereby hiding a portion of the latency period 302 from being experienced by the player. In this embodiment, the destination device may not be completely initialized before the occurrence of the game event ($t_1$), and a portion of the latency period is experienced by the player. In certain such embodiments, either the occurrence of the game event may be an estimated time or the latency period may be an estimated amount of time, and thus the time to begin initializing the device is estimated as well and thus a portion of the actual latency period (t) may extend beyond the actual time occurrence of the game event ($t_1$). There may be other advantageous reasons for not completely eliminating the experienced latency, such as resource cost considerations, gameplay design, among others.

FIG. 3C includes a timeline 340 illustrating an embodiment of the predictive device initialization techniques of the present disclosure in which the actual time of occurrence of the game event ($t_1$) and the actual latency period (t) may be calculated, determined, or otherwise known. Thus, upon the occurrence of the trigger event ($t_0$), the destination device can be initialized at time ($t_1-t$) such that the latency period (t) is over by the time of the game event ($t_1$), thereby hiding the entire latency period and eliminating experienced latency.

FIG. 3D includes a timeline 360 illustrating an embodiment of the predictive device initialization techniques of the present disclosure in which the trigger condition takes into account the actual time of occurrence of the game event ($t_1$) and the actual latency period (t), which may be calculated, determined, or otherwise known. Specifically, a part of the game state associated with the trigger condition is being time (t) before the occurrence of the game event ($t_1$). Thus, such a trigger condition ($t_0'$) occurs at time ($t_1-t$). In this embodiment, the latency period (t) is over by the time of the game event ($t_1$), thereby hiding the entire latency period and eliminating experienced latency.

Figure 6:
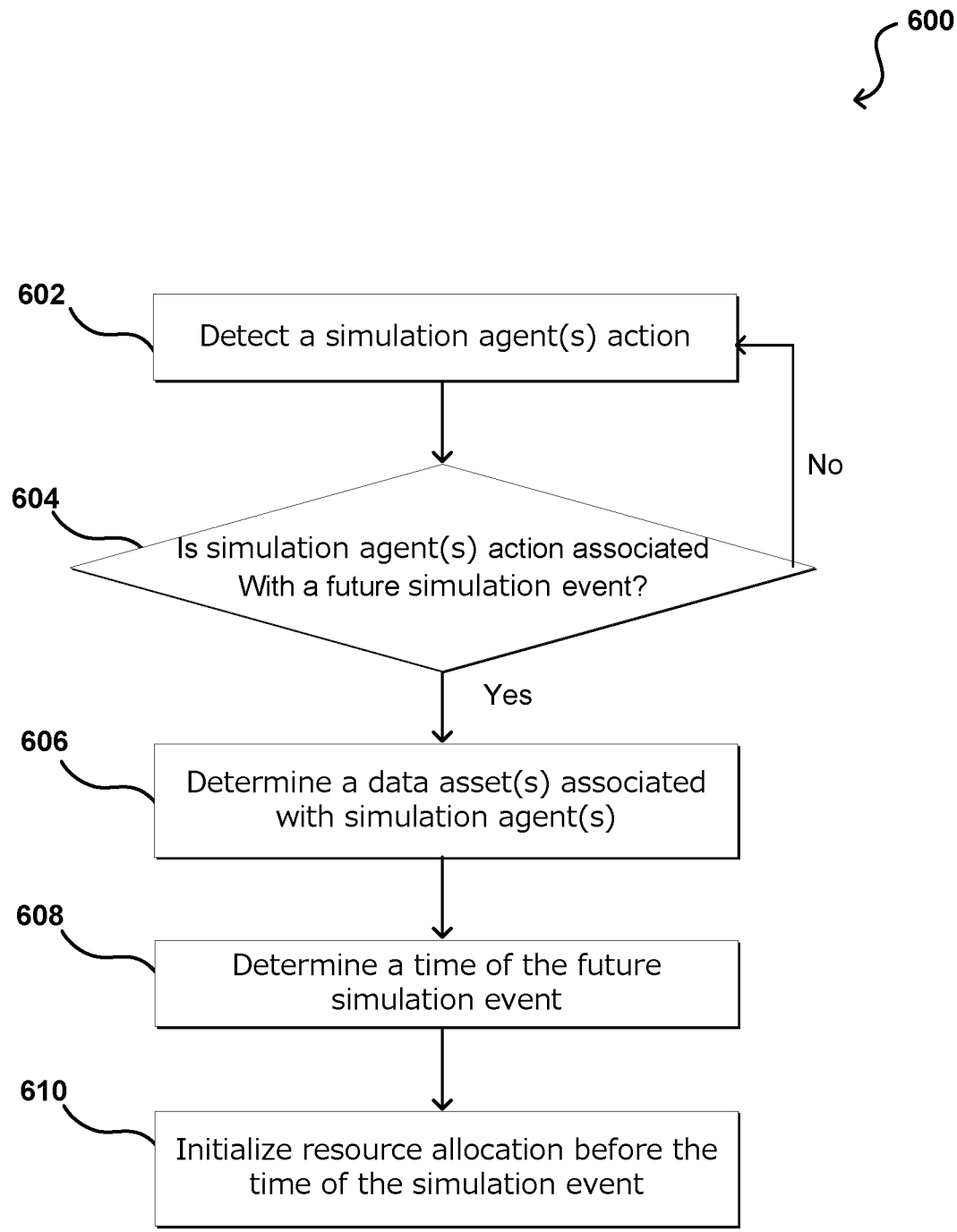
FIG. 6 is a flowchart illustrating a predictive resource allocation process based on agent action, in accordance with various embodiments.

The predictive initialization of a destination device may include various types of actions and be based on various types of trigger conditions. As non-limiting examples, FIG. 4 is directed to predictive device initialization based on trigger conditions associated with location or movement of simulation agents in spatial data structures, and FIG. 6 is directed to predictive device initialization based on trigger conditions associated with general gameplay events or player actions.

Figure 4:
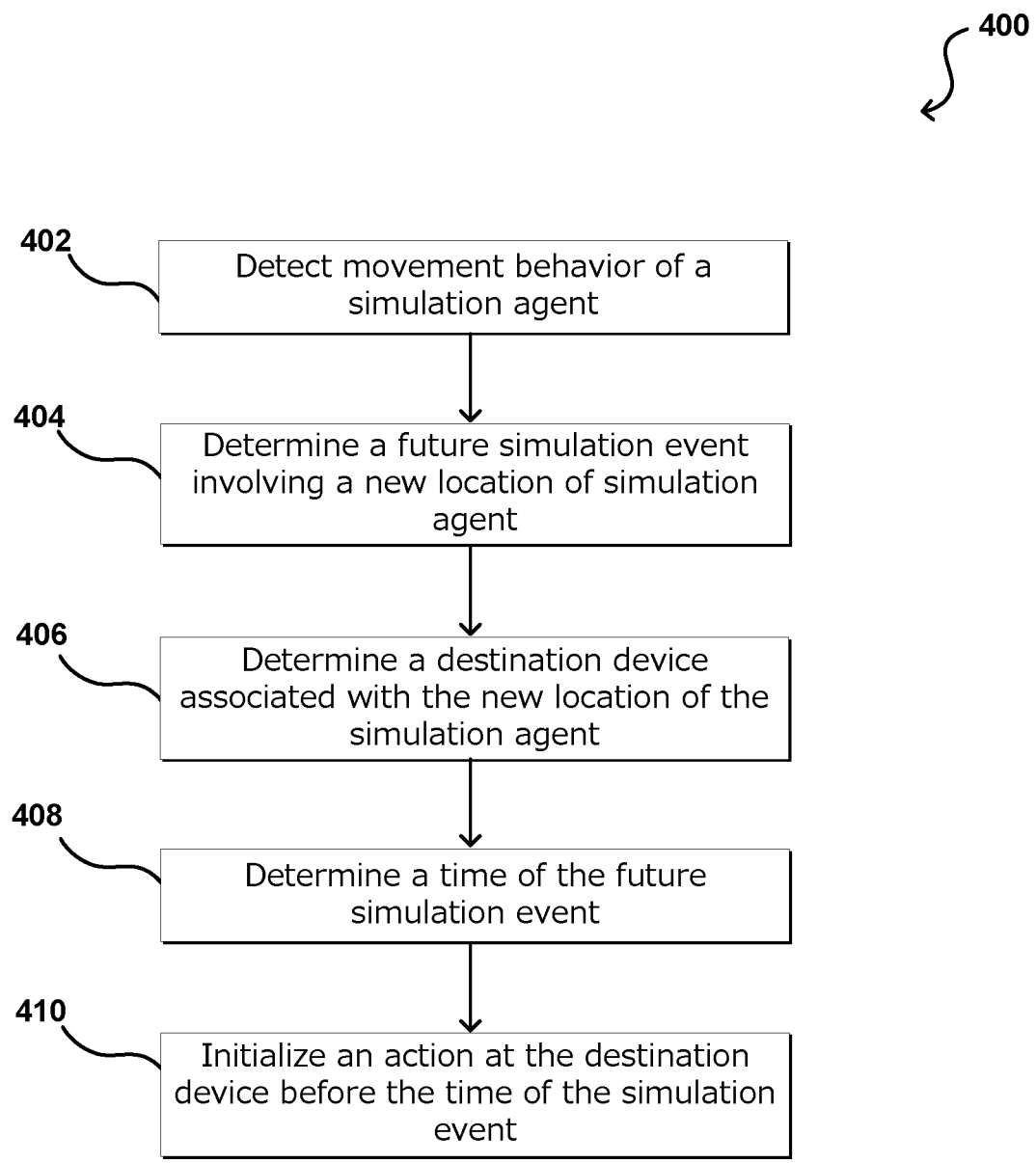
FIG. 4 is a flowchart illustrating a predictive resource allocation process based on the movement of a simulation agent, in accordance with various embodiments.

Specifically, FIG. 4 is a flowchart illustrating a predictive data loading process 400 based on the movement of a simulation agent, in accordance with various embodiments. In an embodiment, the process 400 may be executed by the game host 102 of FIG. 1. In this example, a movement behavior of a simulation agent may be detected during gameplay (402). The movement behavior or movement pattern of a simulation agent may be detected as movement within a spatial data structure, and represent the simulation agent's movement in the simulation environment. A spatial data structure may be any type of data structure for representing positions of elements, such as the simulation agent, in a geometric space such as a plane or volume. Examples of spatial data structures include quadtrees, octrees, r-tree, r+trees, among many others. In some embodiments, the movement behavior is based at least in part on a set of game definitions that define the movement of the simulation agent through the simulation environment under certain conditions. For example, the set of game definitions may include various rules of physics as defined within the game, which may give rise to certain movement behaviors of a simulation agent such as velocity, speed, travel trajectory, among others. Some game conditions that may additionally affect such movement behavior may include designated physical parameters of the simulation agent such as weight, mass, dimensions, among other characteristics. Game conditions may also include player controlled aspects, such as driven speed and direction of the simulation agent, applied load, among others. In some embodiments, the movement behavior may be based at least in part on the simulation agent moving along a predetermined flight path, a present position of the simulation agent, or a previous position of the simulation agent.

A future simulation event may be determined based at least in part on the detected movement behavior of the simulation agent (404). The simulation event may involve a new location of the simulation agent, such as a different region of the simulation environment. For example, it may be predicted based on the movement behavior of the simulation agent that the simulation agent will cross a region boundary from a first region to a second region, the crossing of the region boundary being the simulation event. In some embodiments, different locations are controlled by different devices such as game servers. For example, the first region may be controlled by a source device such as a first game server and the second region may be controlled by a destination device such as a second game server. Accordingly, a data asset representing the simulation agent is used by the first game server when the simulation agent is in the first region and the data asset is used by the second game server when the simulation agent is in the second region. Thus, the device associated with the new location of the simulation agent is determined (406), and such a device is the destination device. In various embodiments, determining a destination device may include allocating a second set of computing resources to support a movement behavior of a simulation agent based, at least in part, on a performance criteria of the movement behavior. In various embodiments, the second set of computing resources includes either additional resources to a first set of resources or a second set of resources different from the first set based, at least in part, on a cost of allocating the second set of computing resources. The movement behavior may then be performed using the second set of computing resources. The first set of resources may be a set of resource utilized control a first region of the simulation environment in which the simulation agent was located before the simulation event. The second set of computing resources may be a set of resources utilized to control a second region of the simulation environment in which the simulation agent is located after the simulation event. Thus, to support the simulation agent being located in the second region, an additional resource may be allocated and used alongside the first set of resources, or a different set of resources may be allocated. For example, one option may be to transfer data assets associated with the simulation agent from the first computing resource to the second computing resource. Another option may be leave the data assets at the first computing resource and transfer authority over at least a portion of the second region from the second computing resource to the first computing resource.

In various embodiments, the way in which the computing resources are allocated may be determined based on various factors, such as resource costs, so that the movement of the simulation agent can be supported with optimal system efficiency. For example, a cost associated with allocation of the additional resources and first set of resources may be determined, and a second cost associated with allocation of a second cost associated with the second set of resources different from the first set may be determined, and the resource allocation option with the least cost may be selected. Example costs include at least one of computation time, memory, load, and bandwidth, among others.

In some embodiments, a time of the predicted simulation event is determined (408). The time may be known, calculated, or estimated. For example, the simulation event refers to the simulation agent crossing the region boundary from the first region to the second region, and the time at which the simulation agent will cross the region boundary may be calculated based on the movement behavior, including various physics related parameters such as observed velocity and/or trajectory of the simulation agent. Thus, the time that the data asset will be used by the second game server, or destination device, can be determined based on such physics related parameters. An action may be initialized at the destination device before the determined time of the predicted simulation event (410). In some embodiments, a data asset representing the simulation agent may be used by a source device, such as a first game server, before the occurrence of the simulation event, and will need to be used by the destination device after the simulation event. Thus, transfer of the data asset from the source device to the destination device is initialized before the occurrence of the simulation event. In the above example, this may include transferring the data asset from the first game server to the second server before the time that the simulation agent is expected to cross the region boundary. In addition to loading a data asset representing a simulation agent the action may include waking the destination device, routing communication to the simulation agent via the destination device, among others.

As mentioned, the movement behavior or movement pattern of a simulation agent represents the simulation agent's movement in the simulation environment, and may be detected as movement within a spatial data structure. The spatial data structure may be any type of data structure for representing positions of elements in a geometric space. Examples of spatial data structures include quadtrees, octrees, r-tree, r+trees, kd-trees, binary space partitioning structures, any hierarchical spatial data structure, among many others.

Figure 5:
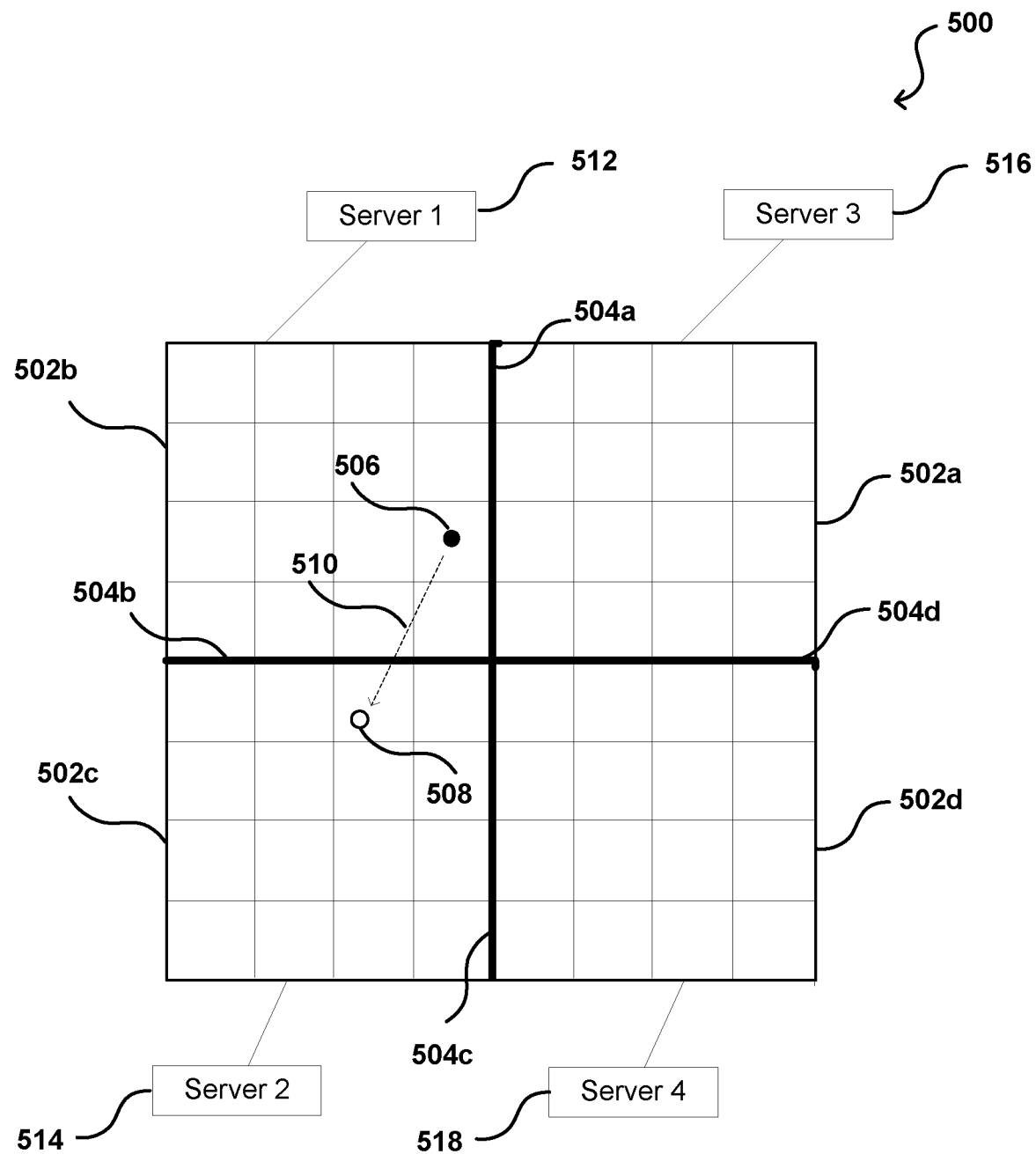
FIG. 5 illustrates a representation of an example spatial data structure, in accordance with various embodiments.

FIG. 5 illustrates a representation of an example spatial data structure 500, in accordance with various embodiments. In this example, the spatial data structure 500 is a quad tree that includes sixty-four data regions that represent physical regions in the game world. In this example, the data structure 500 in divided into four quadrants 502a, 502b, 502c, 502d, each of which is controlled by a different game server, server 3 516, server 1 512, server 2 514, server 4 518, respectively. Thus, all the regions within a quadrant is controlled by the respective game server. The quadrants are separated by boundaries 504a, 504b, 504c, 504d. Thus, a movement behavior of a simulation agent may be detected when the simulation agent is at initial position 506 within quadrant 502b, which is controlled by a first game server 512. It may be predicted, for example based on a known flight path 510 of the simulation agent, that the simulation agent will move to future position 508, which is within quadrant 502c and controlled by a second game sever 514. It may also be determined, either through lookup for estimation, the time at which the simulation agent will cross boundary 504b. The crossing of boundary 504b is the future game event at which point a data asset representing the simulation agent will be used by the second server 514 to control or render the simulation agent. The data asset can be transferred to or loaded at the second server prior to the time at which the simulation agent is to cross boundary 504b. Thus, the simulation agent can be controlled or rendered by the second server 504 with reduced or no experienced latency.

In another embodiment, instead of transferring data from the first server 512 to the second server 514, authority of the first server 512 may be expanded to take over a portion of the quadrant 502c from the second server 514. Thus, the data associated with the simulation agent can remain with the first server and data transfer can be avoided or at least decreased.

In an embodiment, the movement behavior of a group of simulation agents may be detected and it may be predicted that the group of simulation agents may cross a region boundary together or within a certain nominal amount of time. For example, in some gaming context, this may represent a herd of animals running through the game world and from one region to another region in the spatial data structure 500. The group of simulation agents may be associated with a plurality of data assets, or the group of simulation agents may be associated with one data asset that represents the entire group. A future game event involving a future location of the group of simulation agents controlled by a second server may be predicted or determined from the movement behavior of the group, such as an average location or movement or the group. Thus, the data assets representing the simulation agents in the group can be bundled and transferred from a first server to the second server together before the game event, or before the group crosses the boundary. Alternatively, a region of authority of the first server may be expanded to support the future location of the group of simulation agents rather than transferring all the data associated with the group of simulation agents. In some embodiments, the data of some simulation agents may still be transferred, for example, those that fall outside of the boundary of the expanded region of authority. Thus, data transfer can be avoided or at least decreased.

In an embodiment, a simulation agent may be a communicative simulation agent, in that one or more players, other simulation agents, or the game host, may communicate with the simulation agent, for example to control the simulation agent. There may be control stations located in various positioned in the game world and thus represented in the spatial data structure 500. In some embodiments, communications with the simulation agent may be routed through one of these control stations. A control station may be controlled by a device associated with the position of the control station. For example, when the simulation agent is in position 506, communications to the simulation agent may be routed through a control station located in quadrant 502b, and when the simulation agent is in position 508, communications to the simulation agent may be routed through a control station located in quadrant 502c. However, there may be latency in switching communication routing from one control station to another, causing communication issues. Thus, based on the detected movement behavior of the simulation agent, it can be predicted that the simulation agent will cross the boundary 504b and move from quadrant 502b to quadrant 502c. Thus, routing switching may be initiated before the simulation agent crosses the boundary 504b. Specifically, in some embodiments, the device associated with the control station in quadrant 502c, such as the second server 514, may be initiated accordingly.

In an embodiment, position 506 may indicate an initial position of a game player, or a game character controlled by the game player through a client device. When the game player is in position 506 and quadrant 502b, the client device may have certain data assets loaded that correspond to game elements in quadrant 502b, such as scenery or simulation agents that may be visible to the game player. Upon detecting that the game player may move to position 508 in quadrant 502c, certain data assets associated with game elements in quadrant 502c may be preloaded at the client device such that by the time the game player does cross boundary 504b into quadrant 502c, the associated data assets for quadrant 502c will already be loaded and the respective game elements can be seamlessly rendered and visible to the game player. The data assets may already be stored in the client device and loaded from a lower level memory to a higher level memory, or the data assets may be transferred to the client device by the second server 514. In some embodiments, game player data may be transferred from the first server 512 to the second server 514 in anticipation of the game player entering the quadrant 502c.

In some embodiments, it may be detected that in influx of players are signing onto the game or about to enter a certain region in the game world, in which a server may be overloaded. The game servers may predictively balance server load in anticipation of such an event by transferring or sharing control of the game or game region with an underutilized or unused server.

In addition to predictive initialization and data loading based on movement of simulation agents, client devices may also be predictively initialized, for example, to load or receive certain data based on certain trigger conditions, including an agent action. FIG. 6 is a flowchart illustrating a predictive resource allocation process 600 based on an agent action, in accordance with various embodiments. In this example, a player action may be detected (602) and a determination is made whether the player action is associated with a future game event (604). The player action may include any type of gameplay action taken by the player or result from such an action, such as moving towards a certain location, reaching a certain point in a puzzle, reaching a certain score, among many diverse actions. The future game event may include completion of a level, reaching a target destination, teleporting, among many diverse events. In one example, the detection of the player action may indicate that the future game event will occur, in which case the probability of occurrence of the game event is 100%. In another example, the game event may or may not occur, and thus have a probability of occurrence below 100%, and the future game event is determined to be associated with player action if the probability of occurrence is above a certain threshold, for example 75%. If the detected player action is not associated with a future game event, then the process reiterates to detecting another player action (602) until the detected player action is associated with a future game event. In some embodiments, the future event utilizes one or more data assets. Thus, one or more data assets associated with the game event is determined (606). The data asset may include the data needed to render the next game level, a simulation agent coming into view, and the like. The time of the future event may also be determined (608), including estimated. Thus, one or more computing resources may be allocated (610) accordingly before the time of the game event such that when the game event does occur, the computing resource are allocated and the data asset is are is accessible, thereby reducing or eliminating latency effects of data loading experienced. In some embodiments, the data asset may be loaded from memory on the client device or provided from the game host. In addition to loading data, in various embodiments, the future game event may be associated with the use of one or more compute resources in a resource provider environment. In such embodiments, the one or more compute resources may be initialized accordingly, such as receiving an authority transfer, being activated to a wake state from a sleep state, establishing communications, among others.

Figure 7:
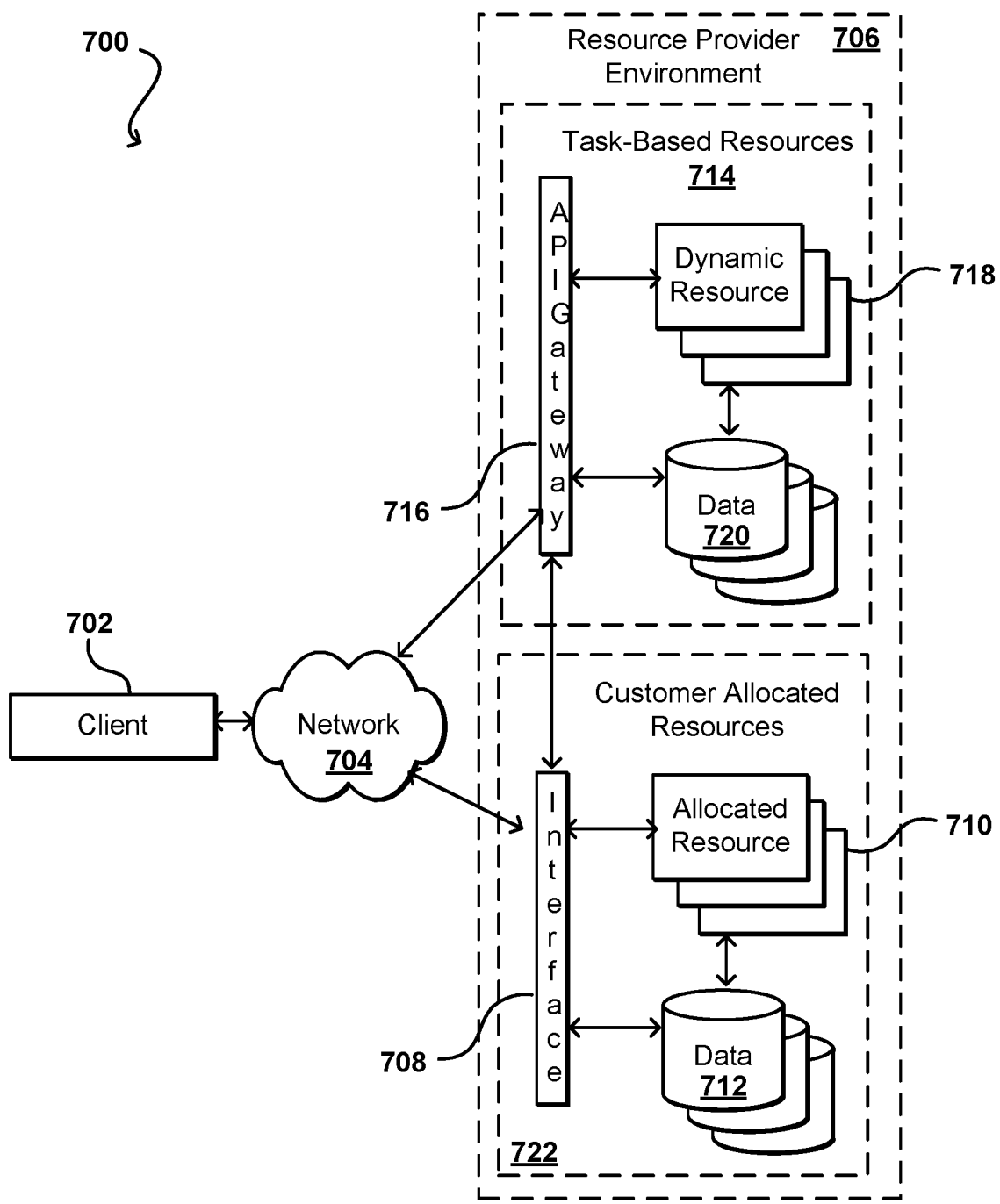
FIG. 7 illustrates an example environment in which aspects predictive resource allocation can be implemented, in accordance with various embodiments.

FIG. 7 illustrates an example environment 700 in which aspects of the various embodiments can be implemented. Specifically, the example system 100 with predictive device initialization of FIG. 1 can be implemented using the resources of example environment 700. As described, device initialization may refer to any action performed to facilitate a resource's ability to carry out functions associated with a game event. Examples of device initialization may include loading data, transferring data, transferring or taking over authority of various game elements or aspects of gameplay, activating or waking a resource, deactivating or sleeping a resource, routing communications to, through, or from the resource. A client device 702 may access or utilize a resource provider environment 706 on which a predictive device initialization system is implemented. The resource provider environment 706 can predictively initialize one or more resources 718, 710 within the resource provider 706 or at the client device 702 such as predictively transferring or loading data, among other initialization actions, in order to hide latency and provide an improved gaming experience to a player using the client device 702. In this example, the client device 702 is able to communicate with a multi-tenant resource provider environment 706 across at least one network 704. In some embodiments, the multi-tenant resource provider environment 706 may host, or otherwise provide, a game that a player can play or otherwise interact with through the client device 702. The client device 702 can include any appropriate electronic device operable to send and receive requests, messages, or other such information over an appropriate network and convey information back to a user of the device. Examples of such client devices include personal computers, gaming consoles, tablet computers, smart phones, notebook computers, and the like. The at least one network 704 can include any appropriate network, including an intranet, the Internet, a cellular network, a local area network (LAN), a specialized gaming network, or any other such network or combination, and communication over the network 704 can be enabled via wired and/or wireless connections. The resource provider environment 706 can include any appropriate components for receiving requests and returning information or performing actions in response to those requests.

In this example, the client device 702 is able to call into two different interface layers, although the interfaces could be part of a single layer or multiple layers in other embodiments. In this example, the client device 702 may make calls into an interface 708 and there can be a set of customer allocated resources 722, both computing resources 710 and data resources 712, among others, allocated on behalf of the customer in the resource provider environment 706. These can be physical and/or virtual resources, but during the period of allocation the resources (or allocated portions of the resources) are only accessible using credentials associated with the customer account. These can include, for example, gaming servers and game databases that are utilized over a period of time for various customer applications. The client device 702 can also make calls into an API gateway 716, or other such interface layer, of a task-based resource environment 714, or sub-environment. In such an environment, portions of various resources such as computing resources 718 and data resources 720, can be allocated dynamically and on a task-specific basis for at least a determined period. There can be resources allocated to perform a specific type of processing, and those resources can be allocated on an as-needed basis where the customer is only charged for the actual processing in response to a specific task. Approaches in accordance with various embodiments can enable customers, such as game developers, to leverage both types of allocations in their applications. This can include, for example, the ability to include on-demand cloud resource support for gaming applications and other such offerings. For example, an application may be developed or hosted on the environment, in which application data and application elements are distributed across one or more of the computing resources 718 and/or data resources 720, and in which the resources 718, 720 are utilized to carry out certain functions of the application. The present techniques provide for predictively initializing the resources 718, 720 to carry out various functions associated with various aspects of the application before such functions are executed such that latency associated with such initialization can be hidden.

The sharing of these multi-tenant resources from a resource provider environment 706 is often referred to as resource sharing, Web services, or "cloud computing," among other such terms and depending upon the specific environment and/or implementation. In at least some embodiments, a user wanting to utilize a portion of the resources can submit a request that is received to an interface layer of the resource provider environment 706. The interface layer can include application programming interfaces (APIs) or other exposed interfaces enabling a user to submit requests to the provider environment. The interface layers in this example can also include other components as well, such as at least one Web server, routing components, load balancers, and the like. When a request to provision a resource is received to the interface layer, information for the request can be directed to a resource manager or other such system, service, or component configured to manage user accounts and information, resource provisioning and usage, and other such aspects. A resource manager receiving the request can perform tasks such as to authenticate an identity of the user submitting the request, as well as to determine whether that user has an existing account with the resource provider, where the account data may be stored in at least one data store in the provider environment. A user can provide any of various types of credentials in order to authenticate an identity of the user to the provider. These credentials can include, for example, a username and password pair, biometric data, a digital signature, or other such information. The provider can validate this information against information stored for the user. If the user has an account with the appropriate permissions, status, etc., the resource manager can determine whether there are adequate resources available to suit the user's request, and if so can provision the resources or otherwise grant access to the corresponding portion of those resources for use by the user for an amount specified by the request. This amount can include, for example, capacity to process a single request or perform a single task, a specified period of time, or a recurring/renewable period, among other such values. If the user does not have a valid account with the provider, the user account does not enable access to the type of resources specified in the request, or another such reason is preventing the user from obtaining access to such resources, a communication can be sent to the user to enable the user to create or modify an account, or change the resources specified in the request, among other such options.

Once the user is authenticated, the account verified, and the resources allocated, the user can utilize the allocated resource(s) for the specified capacity, amount of data transfer, period of time, or other such value. In at least some embodiments, a user might provide a session token or other such credentials with subsequent requests in order to enable those requests to be processed on that user session. The client can receive a resource identifier, specific address, or other such information that can enable the client device to communicate with an allocated resource without having to communicate with the resource manager, at least until such time as a relevant aspect of the user account changes, the user is no longer granted access to the resource, or another such aspect changes.

The resource manager (or another such system or service) in this example can also function as a virtual layer of hardware and software components that handles control functions in addition to management actions, as may include provisioning, scaling, replication, etc. The resource manager can utilize dedicated APIs in the interface layer, where each API can be provided to receive requests for at least one specific action to be performed with respect to the data environment, such as to provision, scale, clone, or hibernate an instance. Upon receiving a request to one of the APIs, a Web services portion of the interface layer can parse or otherwise analyze the request to determine the steps or actions needed to act on or process the call. For example, a Web service call might be received that includes a request to create a data repository.

An interface layer in at least one embodiment includes a scalable set of client-facing servers that can provide the various APIs and return the appropriate responses based on the API specifications. The interface layer also can include at least one API service layer that in one embodiment consists of stateless, replicated servers which process the externally-facing client APIs. The interface layer can be responsible for Web service front end features such as authenticating clients based on credentials, authorizing the client, throttling client requests to the API servers, validating user input, and marshalling or unmarshalling requests and responses. The API layer also can be responsible for reading and writing database configuration data to/from the administration data store, in response to the API calls. In many embodiments, the Web services layer and/or API service layer will be the only externally visible component, or the only component that is visible to, and accessible by, clients of the control service. The servers of the Web services layer can be stateless and scaled horizontally as known in the art. API servers, as well as the persistent data store, can be spread across multiple data centers in a region, for example, such that the servers are resilient to single data center failures.

Such an environment enables organizations to obtain and configure computing resources over a network such as the Internet to perform various types of computing operations (e.g., execute code, including threads, programs, software, routines, subroutines, processes, etc.). Thus, developers can quickly purchase or otherwise acquire a desired amount of computing resources without having to worry about acquiring physical machines. Such computing resources are typically purchased in the form of virtual computing resources, or virtual machine instances. These instances of virtual machines, which are hosted on physical computing devices with their own operating systems and other software components, can be utilized in the same manner as physical computers. For example, an application such as a video game may be developed or hosted on the environment, in which application data and application elements are distributed across one or more physical or virtual computing resources, and in which the resources are utilized to carry out certain functions of the application. The present techniques provide for predictively initializing the resources to carry out various functions associated with various aspects of the application before such functions are executed such that latency associated with such initialization can be hidden.

In many such environments, resource instances such as virtual machines are allocated to a client (or other authorized user) for a period of time in order to process tasks on behalf of that client. In many cases, however, a client may not have a steady flow of work such that the client must maintain a sufficient number of virtual machines to handle peak periods of work but will often have less than this amount of work. This can result in underutilization and unneeded expense for both the client and the resource provider. Approaches in accordance with various embodiments can instead allocate resource instances on a task or event basis to execute a function. A resource instance can be allocated to run a function in response to a client request or event, including performing certain game functions. Once the function has completed that instance can either be made available for processing a different event or destroyed, among other such options. In either case, the client will not be charged for more processing by the instance than was needed to run the function. Implementation of the present predictive device initialization on the environment 700 provides the environment 700 and its resources with the ability to hide latency, thereby, among other reasons, bringing about an improvement in the computing technology.

Figure 8:
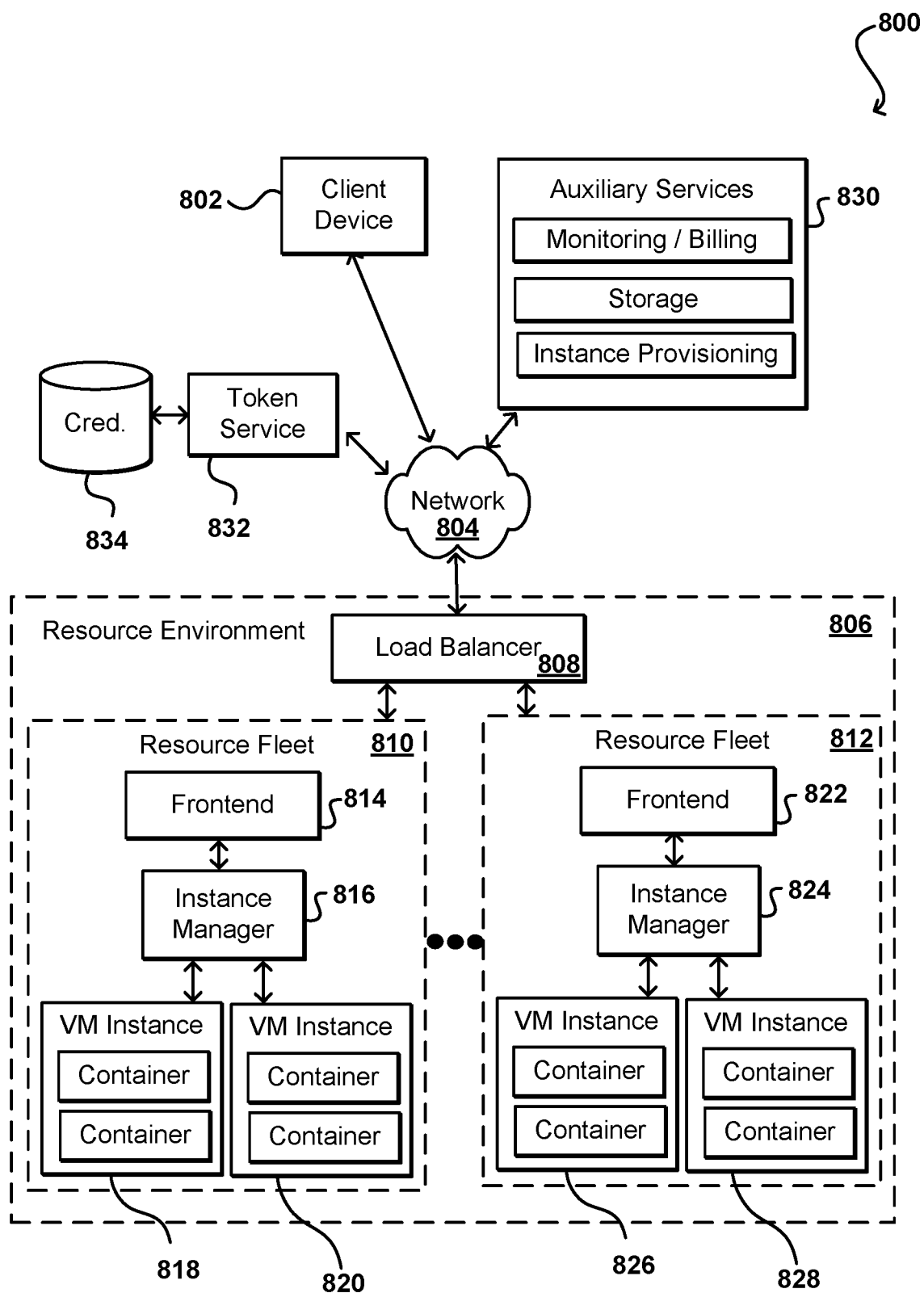
FIG. 8 illustrates components of an example environment that can be used to implement functions for predictive resource allocation, in accordance with various embodiments.

FIG. 8 illustrates components of an example environment 800 that can be used to implement functions for predictive device initialization. Device initialization may refer to any action performed to facilitate a resource's ability to carry out functions associated with a game event. Examples of device initialization may include loading data, transferring data, transferring or taking over authority of various game elements or aspects of gameplay, activating or waking a resource, deactivating or sleeping a resource, routing communications to, through, or from the resource. A client system 802 may access or utilize a resource environment 806 on which a predictive device initialization system is implemented, such that resource provider environment 806 can predictively initialize one or more resources within the resource provider 806 or at the client device 802 in order to hide latency and provide an improved gaming experience to a player using the client device 802. Such functionality can be offered as a service, such as a Web service, in at least some embodiments, wherein a client system 802 can submit requests or event information over at least one network 804 to the resource environment (i.e., a resource provider environment, service provider environment, or other shared resource or multi-tenant environment). The events or requests can each be associated with specific code to be executed in the resource environment. This code can be registered with the system, and will be referred to herein as a registered function, which can be owned by a respective client or available for use by multiple clients, among other such options. The compute service offered by the resource environment can be referred to as a "serverless" compute service that can allocate virtual resources to execute registered functions in response to client events and automatically manage the underlying compute resources. The functions can be executed on high-availability compute infrastructure that can perform the administration of the compute resources, including server and operating system maintenance, capacity provisioning and automatic scaling, code and security patch deployment, and code monitoring and logging. Clients supply the code to be executed and can be billed based on the actual amount of compute time utilized on behalf of those clients.

In some embodiments, a registered function can include the client code as well as associated configuration information. The configuration information can include, for example, the function name and resource requirements. Registered functions can be considered to be "stateless," in that they do not rely on state contained in the infrastructure and considered to be lacking affinity to the underlying infrastructure (e.g., the functions are not installed or otherwise tied to the operating system running in the virtual machine), so that the resource managers can rapidly launch as many copies of the function as is needed to scale to the rate of incoming events. A client providing the code for a function can specify various configuration parameters, such as the memory, timeout period, and access rules, among other such aspects. The client in some embodiments can also specify resources that are able to trigger execution of a registered function by a resource instance. These resources can include, for example, data buckets, database tables, or data streams, among other such options. The resource manager can invoke the code only when needed and automatically scale to support the rate of incoming requests without requiring configuration or management on behalf of the client. A function can be executed by an allocated resource instance within milliseconds of an event in at least some embodiments, and since the service scales automatically the performance will remain consistently high as the frequency of events increases. Further, since the code is stateless the service can initialize as many resource instances as needed without lengthy deployment and configuration delays.

Routing information for client requests or events to execute on a virtual compute fleet (e.g., a group of virtual machine instances that may be used to service such requests) based on the frequency of execution of the user code enables high frequency user code to achieve high distribution, which can be good for fault tolerance, and enables low frequency user code to achieve high consolidation, which can be good for cost reduction.

An environment such as that described with respect to FIG. 8 can facilitate the handling of requests to execute user code on a virtual compute fleet by utilizing the containers created on the virtual machine instances as compute capacity. Information for a request or event can be received to a load balancer 808 that can determine an appropriate resource fleet 810, 812 to which to direct the information. As will be discussed in more detail later herein, the decision can be based upon various types of information, as may include the context associated with the type of event or request. Upon receiving a request to execute user code on a selected virtual compute fleet 810, 812, a frontend service 814, 822 associated with the virtual compute fleet can provide the information to an instance manager, which can direct the information to a virtual machine (VM) instance 818, 820, 826, 828 where a container on the instance can provide an execution environment for the registered function.

The client device 802 may utilize one or more user interfaces, command-line interfaces (CLIs), application programing interfaces (APIs), and/or other programmatic interfaces for generating and uploading client code, invoking the client code (e.g., submitting a request to execute the code on the virtual compute system), scheduling event-based jobs or timed jobs, tracking the client code, and/or viewing other logging or monitoring information related to their requests and/or client code. Although one or more embodiments may be described herein as using a user interface, it should be appreciated that such embodiments may, additionally or alternatively, use any CLIs, APIs, or other programmatic interfaces.

In the example of FIG. 8, the resource environment 806 is illustrated as being connected to at least one network 804. In some embodiments, any of the components within the recourse environment can communicate with other components (e.g., client computing devices 802 and auxiliary services 830, which may include monitoring/logging/billing services, storage service, an instance provisioning service, and/or other services that may communicate with components or services of the resource environment 806. In other embodiments, only certain components such as the load balancer 808 and/or the frontends 814, 822 may be connected to the network 804, and other components of the virtual resource service (i.e., components of the resource fleets) may communicate with other components of the resource environment 806 via the load balancer 808 and/or the frontends 814, 822.

Client may use the resource fleets 810, 812 to execute user code thereon. For example, a client may wish to run a piece of code in connection with a web or mobile application that the client has developed. One way of running the code would be to acquire virtual machine instances from service providers who provide infrastructure as a service, configure the virtual machine instances to suit the client's needs, and use the configured virtual machine instances to run the code. Alternatively, the client may send the resource service a code execution request. The resource service can handle the acquisition and configuration of compute capacity (e.g., containers, instances, etc., which are described in greater detail below) based on the code execution request, and execute the code using the compute capacity. The allocation may automatically scale up and down based on the volume, thereby relieving the client from the burden of having to worry about over-utilization (e.g., acquiring too little computing resources and suffering performance issues) or under-utilization (e.g., acquiring more computing resources than necessary to run the codes, and thus overpaying).

In the configuration depicted in FIG. 8, a first resource fleet 810 includes a frontend 814, an instance manager 816 (later referred to herein as a worker manager), and virtual machine instances 818, 820. Similarly, other resource fleets 812 can also include a frontend 822, an instance manager 824, and virtual machine instances 826, 828, and there can be any appropriate number of resource fleets and any appropriate number of instances in each resource fleet. The environment can include low and high frequency fleets as well in at least some embodiments, as may serve different types of requests or requests for different types of clients. The fleets can also include any number of worker managers, and in some embodiments the frontend and the worker manager can be resident on a single virtual machine instance.

In some embodiments, the load balancer 808 serves as a front door to all the other services provided by the virtual compute system. The load balancer 808 processes requests to execute user code on the virtual compute system and handles the first level of load balancing across the frontends 814, 822. For example, the load balancer 808 may distribute the requests among the frontends 814, 822 (e.g., based on the individual capacity of the frontends). The requests can be distributed evenly across the frontends or distributed based on the available capacity on the respective fleets, among other such options.

Client code as used herein may refer to any program code (e.g., a program, routine, subroutine, thread, etc.) written in a program language. Such client code may be executed to achieve a specific task, for example, in connection with a particular web application or mobile application developed by the user. For example, the client code may be written in JavaScript (node.js), Java, Python, and/or Ruby. The request may include the client code (or the location thereof) and one or more arguments to be used for executing the client code. For example, the client may provide the client code along with the request to execute the client code. In another example, the request may identify a previously uploaded program code (e.g., using the API for uploading the code) by its name or its unique ID. In yet another example, the code may be included in the request as well as uploaded in a separate location (e.g., the external storage service or a storage system internal to the resource environment 806) prior to the request is received by the load balancer 808. The virtual compute system may vary its code execution strategy based on where the code is available at the time the request is processed.

In some embodiments, the frontend 814 for a fleet can determine that the requests are properly authorized. For example, the frontend 814 may determine whether the user associated with the request is authorized to access the client code specified in the request. The frontend 814 may receive the request to execute such client code in response to Hypertext Transfer Protocol Secure (HTTPS) requests from a client, or user associated with that client. Also, any information (e.g., headers and parameters) included in the HTTPS request may also be processed and utilized when executing the client code. As discussed above, any other protocols, including, for example, HTTP, MQTT, and CoAP, may be used to transfer the message containing the code execution request to the frontend 814. The frontend 814 may also receive the request to execute such client code when an event is detected, such as an event that the client has registered to trigger automatic request generation. For example, the client may have registered the client code with an auxiliary service 830 and specified that whenever a particular event occurs (e.g., a new file is uploaded), the request to execute the client code is sent to the frontend 814. Alternatively, the client may have registered a timed job (e.g., execute the user code every 24 hours). In such an example, when the scheduled time arrives for the timed job, the request to execute the client code may be sent to the frontend 814. In yet another example, the frontend 814 may have a queue of incoming code execution requests, and when the batch job for a client is removed from the virtual compute system's work queue, the frontend 814 may process the client request. In yet another example, the request may originate from another component within the resource environment 806 or other servers or services not illustrated in FIG. 8.

A client request may specify one or more third-party libraries (including native libraries) to be used along with the client code. In one embodiment, the client request is a ZIP file containing the client code and any libraries (and/or identifications of storage locations thereof) that are to be used in connection with executing the client code. In some embodiments, the client request includes metadata that indicates the program code to be executed, the language in which the program code is written, the client associated with the request, and/or the computing resources (e.g., memory, etc.) to be reserved for executing the program code. For example, the program code may be provided with the request, previously uploaded by the client, provided by the virtual compute system (e.g., standard routines), and/or provided by third parties. In some embodiments, such resource-level constraints (e.g., how much memory is to be allocated for executing a particular user code) are specified for the particular client code, and may not vary over each execution of the client code. In such cases, the virtual compute system may have access to such resource-level constraints before each individual request is received, and the individual requests may not specify such resource-level constraints. In some embodiments, the client request may specify other constraints such as permission data that indicates what kind of permissions that the request has to execute the user code. Such permission data may be used by the virtual compute system to access private resources (e.g., on a private network).

In some embodiments, the client request may specify the behavior that should be adopted for handling the client request. In such embodiments, the client request may include an indicator for enabling one or more execution modes in which the client code associated with the client request is to be executed. For example, the request may include a flag or a header for indicating whether the client code should be executed in a debug mode in which the debugging and/or logging output that may be generated in connection with the execution of the client code is provided back to the client (e.g., via a console user interface). In such an example, the virtual compute system may inspect the request and look for the flag or the header, and if it is present, the virtual compute system may modify the behavior (e.g., logging facilities) of the container in which the client code is executed, and cause the output data to be provided back to the client. In some embodiments, the behavior/mode indicators are added to the request by the user interface provided to the client by the virtual compute system. Other features such as source code profiling, remote debugging, etc. may also be enabled or disabled based on the indication provided in the request.

The frontend 814 can receive requests to execute client code on the virtual compute system that have been processed by the load balancer 808. The frontend 814 can request the instance manager 816 associated with the frontend 814 of the particular fleet 810 to find compute capacity in one of the virtual machine instances 818, 820 managed by the instance manager 816. The frontend 814 may include a usage data manager for determining the usage status (e.g., indicating how frequently the user code is executed) of a particular client code, and a client code execution manager for facilitating the execution of client code on one of the virtual machine instances managed by the worker manager. The instance manager 816 manages the virtual machine instances in the respective fleet. After a request has been successfully processed by the load balancer 808 and the frontend 814, the instance manager 816 finds capacity to service the request to execute client code on the virtual compute system. For example, if a container exists on a particular virtual machine instance that has the user code loaded thereon, the instance manager 816 may assign the container to the request and cause the request to be executed in the container. Alternatively, if the client code is available in the local cache of one of the virtual machine instances, the instance manager 816 may create a new container on such an instance, assign the container to the request, and cause the client code to be loaded and executed in the container. Otherwise, the instance manager 816 may assign a new virtual machine instance to the client associated with the request from the pool of pre-initialized and pre-configured virtual machine instances, download the client code onto a container created on the virtual machine instance, and cause the client code to be executed in the container.

In some embodiments, the virtual compute system is adapted to begin execution of the client code shortly after it is received (e.g., by the load balancer 808 or frontend 814). A time period can be determined as the difference in time between initiating execution of the client code (e.g., in a container on a virtual machine instance associated with the client) and receiving a request to execute the client code (e.g., received by a frontend). The virtual compute system can be adapted to begin execution of the client code within a time period that is less than a predetermined duration. The client code may be downloaded from an auxiliary service 830. The data may comprise user code uploaded by one or more clients, metadata associated with such client code, or any other data utilized by the virtual compute system to perform one or more techniques described herein. Although only the storage service is illustrated in the example of FIG. 8, the resource environment 806 may include other levels of storage systems from which the client code may be downloaded. For example, each instance may have one or more storage systems either physically (e.g., a local storage resident on the physical computing system on which the instance is running) or logically (e.g., a network-attached storage system in network communication with the instance and provided within or outside of the virtual compute system) associated with the instance on which the container is created. Alternatively, the code may be downloaded from a web-based data store provided by the storage service.

In some embodiments, once a virtual machine instance has been assigned to a particular client, the same virtual machine instance cannot be used to service requests of any other client. This provides security benefits to clients by preventing possible co-mingling of user resources. Alternatively, in some embodiments, multiple containers belonging to different clients (or assigned to requests associated with different clients) may co-exist on a single virtual machine instance. Such an approach may improve utilization of the available compute capacity. Although the virtual machine instances are described here as being assigned to a particular client, in some embodiments the instances may be assigned to a group of clients, such that an instance is tied to the group of clients and any member of the group can utilize resources on the instance. For example, the clients in the same group may belong to the same security group (e.g., based on their security credentials) such that executing one member's code in a container on a particular instance after another member's code has been executed in another container on the same instance does not pose security risks. Similarly, the instance manager 816 may assign the instances and the containers according to one or more policies that dictate which requests can be executed in which containers and which instances can be assigned to which clients. An example policy may specify that instances are assigned to collections of clients who share the same account (e.g., account for accessing the services provided by the virtual compute system). In some embodiments, the requests associated with the same client group may share the same containers (e.g., if the client code associated therewith are identical). In some embodiments, a request does not differentiate between the different clients of the group and simply indicates the group to which the clients associated with the requests belong. In some embodiments, the virtual compute system may maintain a separate cache in which client code is stored to serve as an intermediate level of caching system between the local cache of the virtual machine instances and a web-based network storage (e.g., accessible via the network 804).

The instance manager 816 may also manage creation, preparation, and configuration of containers within virtual machine instances. Containers can be logical units within a virtual machine instance and utilize resources of the virtual machine instances to execute client code. Based on configuration information associated with a request to execute client code, such a container manager can create containers inside a virtual machine instance. In one embodiment, such containers are implemented as Linux containers.

After the client code has been executed, the instance manager 816 may tear down the container used to execute the user code to free up the resources it occupied to be used for other containers in the instance. Alternatively, the instance manager 816 may keep the container running to use it to service additional requests from the same client. For example, if another request associated with the same client code that has already been loaded in the container, the request can be assigned to the same container, thereby eliminating the delay associated with creating a new container and loading the client code in the container. In some embodiments, the instance manager 816 may tear down the instance in which the container used to execute the client code was created. Alternatively, the instance manager 816 may keep the instance running to use the instance to service additional requests from the same client. The determination of whether to keep the container and/or the instance running after the user code is done executing may be based on a threshold time, the type of the user, average request volume of the user, and/or other operating conditions.

In some embodiments, the virtual compute system may provide data to one or more of the auxiliary services 830 as the system services incoming code execution requests. For example, the virtual compute system may communicate with the monitoring/logging/billing services, which may include: a monitoring service for managing monitoring information received from the virtual compute system, such as statuses of containers and instances on the virtual compute system; a logging service for managing logging information received from the virtual compute system, such as activities performed by containers and instances on the virtual compute system; and a billing service for generating billing information associated with executing client code on the virtual compute system (e.g., based on the monitoring information and/or the logging information managed by the monitoring service and the logging service). In addition to the system-level activities that may be performed by the monitoring/logging/billing services (e.g., on behalf of the virtual compute system) as described above, the monitoring/logging/billing services may provide application-level services on behalf of the client code executed on the virtual compute system. For example, the monitoring/logging/billing services may monitor and/or log various inputs, outputs, or other data and parameters on behalf of the client code being executed on the virtual compute system. Although shown as a single block, the monitoring, logging, and billing services may be provided as separate services.

In some embodiments, the instance manager 816 may perform health checks on the instances and containers managed by the instance manager (e.g., an "active pool" of virtual machine instances managed by the instance manager and currently assigned to one or more clients). For example, the health checks performed by the instance manager 816 may include determining whether the instances and the containers managed by the instance manager have any issues of (1) misconfigured networking and/or startup configuration, (2) exhausted memory, (3) corrupted file system, (4) incompatible kernel, and/or any other problems that may impair the performance of the instances and the containers. In one embodiment, the instance manager 816 performs the health checks periodically. In some embodiments, the frequency of the health checks may be adjusted automatically based on the result of the health checks. In other embodiments, the frequency of the health checks may be adjusted based on client requests. In some embodiments, the instance manager 816 may perform similar health checks on the instances and/or containers in the pool of pre-warmed virtual machine instances that are not yet assigned to any client but ready to service incoming requests. The instances and/or the containers in such a warming pool may be managed either together with those instances and containers in the active pool or separately. In some embodiments, in the case where the health of the instances and/or the containers in the warming pool is managed separately from the active pool, a separate warming pool manager that manages the warming pool may perform the health checks described above on the instances and/or the containers in the warming pool.

The virtual machine instances can be logical in nature and implemented by a single or multiple physical computing devices. At least some of the virtual machine instances may be provisioned to provide a variety of different desired conditions depending on the needs of the user. Examples of the types of desired conditions include, but are not limited to: particular operating systems, particular language runtimes, and particular libraries that may be utilized by the user code. Additionally, one or more virtual machine instances may be provisioned generically when a desired operating condition is not specified or is otherwise not available. One skilled in the relevant art will appreciate that the virtual compute system is logical in nature and can encompass physical computing devices from various geographic regions.

The frontend 814, 822 can route code-processing requests according to a method that is different than the method used by the load balancer 808 to route requests among the frontends. For example, a frontend 814 can route the requests to the specific instance manager based on the client code and/or based on the client associated with the client code. In some embodiments, the routing is determined based on a consistent-hashing scheme in which one or more parameters associated with the request (e.g., client ID, client code ID, etc.) are hashed according to a hash function and the request is sent to one of the instance managers that has previously been assigned to the sections of a hash ring (e.g., containing a plurality of hash values) that corresponds to the resulting hash value. For example, the instance managers can occupy one or more sections of the hash ring, and the requests can be mapped to those same hash values. In some embodiments, the hash values may be integer values, and each instance manager may be associated with one or more integer values. The one or more integer values associated with a particular instance manager may be determined based on one or more parameters associated with the instance manager (e.g., IP address, instance ID, etc.). In some embodiments, the request may be sent to the instance manager whose associated integer values are closest to, but not larger than, the hash value calculated for that request (e.g., using modulo arithmetic).

When the frontends determine that one or more instance managers have become unavailable, the frontends can associate the hash values previously associated with the one or more instance managers that have become unavailable with one or more available instance managers in another fleet. Similarly, when a new instance manager is added to a fleet, the new instance manager may take a share of the hash values associated with the existing instance managers. For example, the new instance manager may be assigned one or more sections of the hash ring that were previously assigned to the existing instance managers.

As mentioned, resource capacity can be allocated as needed to execute code or perform specific tasks, which can be allocated in response to various events. The events can include any appropriate types of events, as may be permitted by a service provider or allowed through various rules or policies, among other such options. These can include, for example, modifications to data buckets or updates to data tables, among other such options. The dynamic allocation of such capacity enables service owners to get out of the business of provisioning and managing the underlying hardware for executing code. For flexibility and efficiency in resource management, such a platform or service might not make any guarantees with respect to reusing the same containers or resource instances for running a specific instance of code, such as a registered function, for all incoming requests.

As mentioned, in order to process various types of events a resource instance for a registered function may require access to various other resources, data sources, or other relevant systems or functionality in (or outside) a resource allocation environment. In some embodiments, a function can be configured with a specified role or identity, which will have various associated permissions and privileges. A registered function can be associated with a determined role, and when a resource instance is allocated for the registered function, the resource instance can be provided with an access token, or other appropriate security credential, which can provide the access needed for that function. As illustrated in the example 800 of FIG. 8, the token can be provided by a token service 832, which can be internal or external to the resource environment 806, and may managed by the resource provider or a third party in various embodiments. The token service can store information about various types of roles and access in a credential repository 834, or other appropriate location, and in response to a request for an access token for a registered function, can determine the appropriate role and permissions and provide a corresponding access token to be provided to the allocated resource instance. The frontend 814 or instance manager 816 for a relevant resource fleet 810 can cause the configured role to be bound to the relevant host(s) when an instance of a registered function is created on that host. The role can be bound as an instance profile or other such mechanism. Once the role is bound, the resource instance can assume the bound identity for accessing various resources or dependencies, as may include various data sources, internal or external resource, or network functionality, among other such options. The resource instance can thus obtain the temporary credentials needed to execute the registered function and process the event.

Using such an identity management model, the function instances triggered by any event could thus have access to credentials with the same privileges. For example, a registered function can have input access to a specified data bucket specified in the triggering event and write access to a corresponding database table. The assigned identity role for this function could then allow any function instance to read from any available bucket from that data source and write into any available table in the relevant database. A vulnerability present in the registered lambda function (i.e., an extensible markup language (XML) external entity resolution) could allow a producer of an event to hijack the credentials for the registered function, such as by using an XML external entity attack and retrieving the credentials from a local metadata endpoint for the data source. The security breach might then spread across the buckets of all function owners as well as all available tables in the database.

Accordingly, approaches in accordance with various embodiments attempt to enhance security and limit the impact of any vulnerabilities by creating and delivering temporary credentials for each event, or type of event, that can act as a trigger for a registered function. While the registered function might be associated with a role having a broader set of permissions, the temporary credentials derived therefrom can have privileges restricted to those required to process the triggering event. A function owner can define one or more parameterized access policies for his or her registered function(s) that can be based at least in part upon the types of triggering events for that registered function. The resource allocation service can use these parameterized access policies to generate policy instances corresponding to each event, and use the policy instances for creating and delivering the temporary credentials with each event. Implementation of the present predictive device initialization on the environment 800 provides the environment 800 and its resources with the ability to hide latency, thereby, among other reasons, bringing about an improvement in the computing technology.

Figure 9:
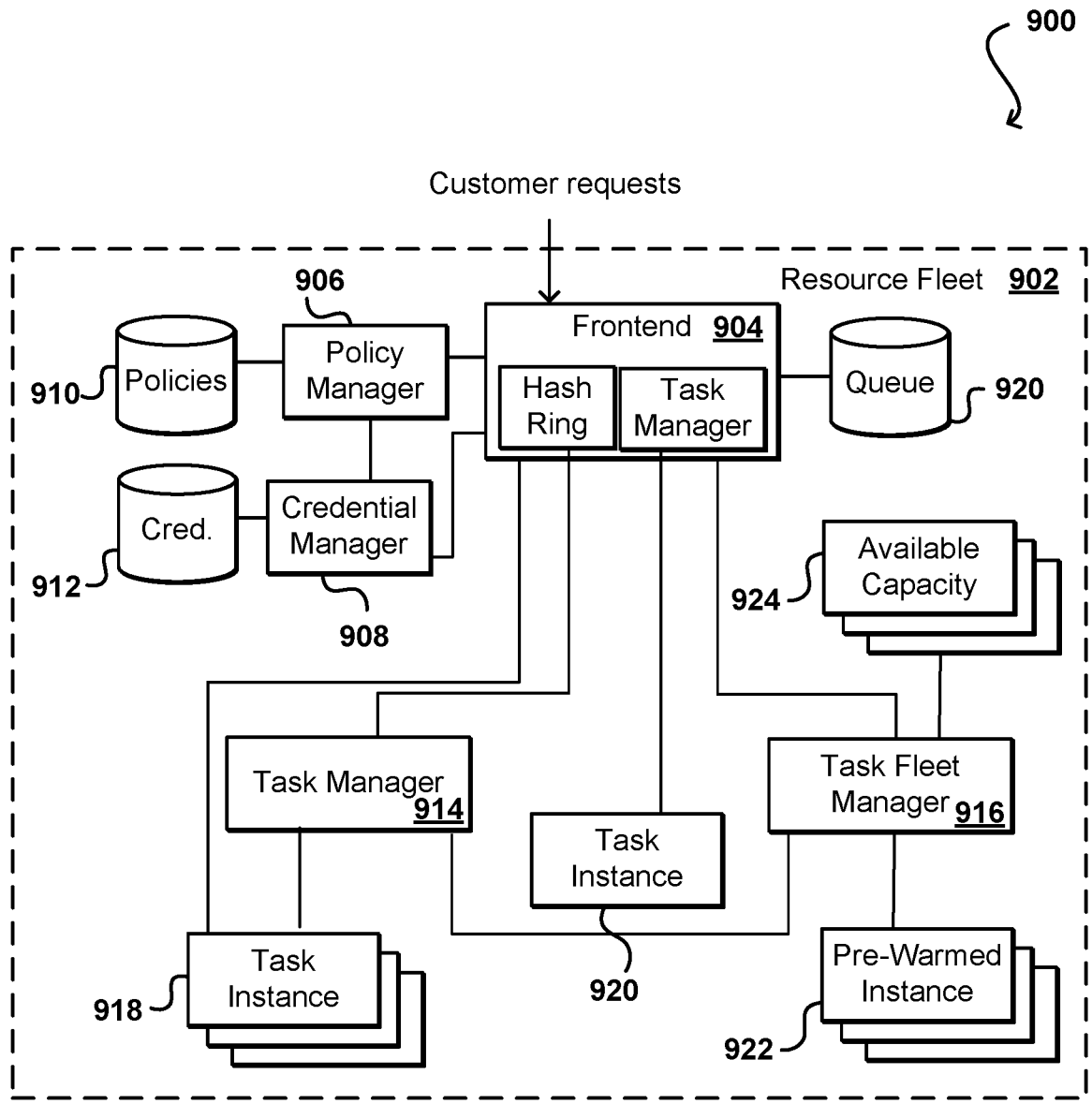
FIG. 9 illustrates an example environment that can be used to implement at least some of the functionality of predictive resource allocation, in accordance with various embodiments.

FIG. 9 illustrates an example environment 900 that can be used to implement at least some of the functionality of the predictive device initialization system, in which resources may be predictively initialized to hide latency and provide an improved gaming experience. In this example, information for client requests or events can be directed to a resource fleet 902. The information can be directed using a load balancer and/or interface layer as discussed previously as part of a resource allocation environment. In this example the resource instances will be referred to as "workers," which in various embodiments can refer to the virtual machine instances 818, 820, 826, 828 described with respect to FIG. 8. It should be understood, however, that various other types of resource instances can be utilized as workers as well within the scope of the various embodiments.

As described, the frontend 904 may receive an event notification, client request, or other event information that indicates an event has occurred for which a registered function should be utilized or processing. In this example, the frontend 904 can determine the appropriate registered function and place the event information in an event queue 920. In other embodiments the event information might be placed into the event queue before determining the registered function, or the event information might specify the registered function, among other such options. Further, in this event the frontend 904 and/or a worker manager of the frontend can place the event information in the event queue 920, while in other embodiments other worker managers 914, 916 might receive the information and place the information in the same, or a different queue, among other such options. The frontend, worker manager, or a separate queue manager can determine that a worker 918 is now available to process the event information using the respective registered function. This can include, for example, determining that a new instance should be initialized to process the event as well as allocating an existing instance, etc. The respective worker manager 914 can then allocate the relevant worker 918 for the event, pull the event information from the event queue 920, and provide the information to the allocated worker 918 for processing using the registered function. The manager 916 may also monitor the available capacity 924 and a pool of pre-warmed virtual machine instances 922 that are not yet assigned to any client but ready to service incoming requests.

At some subsequent point, the allocated worker 914 will complete processing for the event. This can occur for a number of different reasons as discussed elsewhere herein. The allocated instance can return a result of the processing that can be received back to the worker manager 914 and/or the frontend 904. In some embodiments the result will go to the worker manager, so the manager knows the instance is available for processing another event, and then can go to the frontend, so the frontend can provide any appropriate response or take another appropriate action.

In order to process the event, a worker 918 will have to be allocated for the relevant registered function. As mentioned, the worker will need to obtain the appropriate access credential(s) for the registered function, as may be determined by a role bound to that instance for the registered function. As mentioned, the role can provide various types of access for a determined period of time, such as fifteen minutes in some embodiments, although other lengths of time can be specified as well. Since there can be various types of triggering events for a function, the role can enable access to all relevant data for any of those events for the entire lifecycle of the function. As mentioned, however, granting all the access provided under the role can enable any vulnerability in the registered function to access data outside the scope of the registered function, and potentially exfiltrate the credentials outside of the function for various other purposes. As an example, various parsers might be used to ingest and process different types of documents, and without a security review of those parsers there is potential that parsing of an untrusted document could expose access to the function credentials.

Accordingly, approaches in accordance with various embodiments can provide event-specific credentials that are derived from an identity role bound, or otherwise associated, to the registered function for a resource instance. The necessary privileges can be provided under the role, but the restricted credentials can prevent access outside that needed to process the event. A system, component, or service such as a credential manager 908 can create a temporary token that has access only to those input and output sources required for processing the event, and can cause that token to be passed to the relevant worker 918 allocated for the event. The event-specific credential can be bound to the resource instance allocated in response to a specific event, and the permissions granted under the temporary credential determined based upon the specific event. The credential manager 908 can generate a temporary token that is event-specific, and can cause that temporary token to also be stored to a credential repository 912 or other appropriate cache such that the credentials can be passed to any other resource instance allocated for a registered function in response to the same type of event.

The event-specific credential can be generated according to the security token bound to the registered function and received from the token service in at least some embodiments. In order to determine which subset of permissions to be granted from the token, a function owner can define one or more relevant access policies that can be stored to a relevant policy data store 910 or other accessible location. A policy manager 906, or other such system or service, can work with the credential manager 908 to determine the appropriate policy for an event, which the credential manager 908 can then use to determine the appropriate permissions and generate the temporary credential to be provided to the allocated worker 918. The policy manager in some embodiments can maintain a mapping between the policies and events, in order to derive the appropriate temporary credentials from the function role. It should be understood that in at least some embodiments the policy manager 906 and/or credential manager 908 could be implemented in the frontend 904, an event router, or another such component discussed or suggested herein.

In at least some embodiments a function owner can provide a template policy which includes variables whose values will be specific to an event. This can include, for example, identifiers for the input and output data sources to which access can be granted, as well as the type of access and other such information. For each event, the available access for the relevant role can be determined, and the variable values for the event inserted into the template policy. The policy manager can then ensure that the permissions per the policy are contained within the overall permissions of the role, and if so can generate the temporary credential to be provided to the allocated worker. In some embodiments the credential manager can generate the event-specific credentials, while in other embodiments the credential manager can submit a request to the token service to receive an event-specific token, among other such options. As mentioned, the credential manager 908 can cache a received event-specific token in a local credential cache 912 to be used for other similar events for the registered function over the lifetime of the temporary credential.

In some embodiments the frontend 904 or worker manager 914 will perform a lookup to determine the relevant role for a function before performing the worker allocation. The frontend or worker manager can also, directly or via a policy manager 906, determine the appropriate template policy mapped to the specific event. The frontend or worker manager can then, directly or via the credential manager, begin filling in the template using the event-specific values. As an example, a registered function might be triggered by a notification event on a storage service, and the event can be received from any bucket on that storage service. Implementation of the present predictive device initialization on the environment 900 provides the environment 900 and its resources with the ability to hide latency, thereby, among other reasons, bringing about an improvement in the computing technology.

Figure 10:
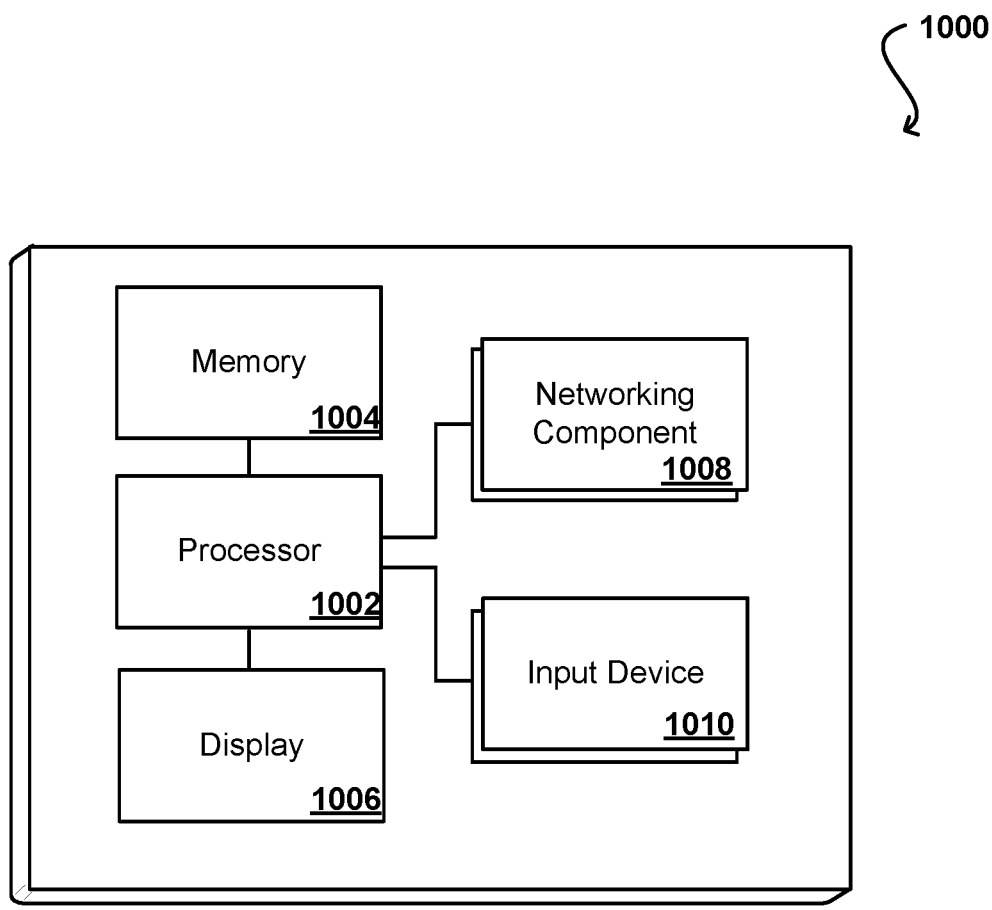
FIG. 10 illustrates a set of basic components of an example computing device that can be utilized to implement aspects of the various embodiments.

FIG. 10 illustrates a set of basic components of an example computing device 1000 that can be utilized to implement aspects of the various embodiments. In this example, the device includes at least one processor 1002 for executing instructions that can be stored in a memory device or element 1004. As would be apparent to one of ordinary skill in the art, the device can include many types of memory, data storage or computer-readable media, such as a first data storage for program instructions for execution by the at least one processor 1002, the same or separate storage can be used for images or data, a removable memory can be available for sharing information with other devices, and any number of communication approaches can be available for sharing with other devices. The device may include at least one type of display element 1006, such as a touch screen, electronic ink (e-ink), organic light emitting diode (OLED) or liquid crystal display (LCD), although devices such as servers might convey information via other means, such as through a system of lights and data transmissions. The device typically will include one or more networking components 1008, such as a port, network interface card, or wireless transceiver that enables communication over at least one network. The device can include at least one input device 1010 able to receive conventional input from a user. This conventional input can include, for example, a push button, touch pad, touch screen, wheel, joystick, keyboard, mouse, trackball, keypad or any other such device or element whereby a user can input a command to the device. These I/O devices could even be connected by a wireless infrared or Bluetooth or other link as well in some embodiments. In some embodiments, however, such a device might not include any buttons at all and might be controlled only through a combination of visual and audio commands such that a user can control the device without having to be in contact with the device.

As discussed, different approaches can be implemented in various environments in accordance with the described embodiments. As will be appreciated, although a Web-based environment is used for purposes of explanation in several examples presented herein, different environments may be used, as appropriate, to implement various embodiments. The system includes an electronic client device, which can include any appropriate device operable to send and receive requests, messages or information over an appropriate network and convey information back to a user of the device. Examples of such client devices include personal computers, cell phones, handheld messaging devices, laptop computers, set-top boxes, personal data assistants, electronic book readers and the like. The network can include any appropriate network, including an intranet, the Internet, a cellular network, a local area network or any other such network or combination thereof. Components used for such a system can depend at least in part upon the type of network and/or environment selected. Protocols and components for communicating via such a network are well known and will not be discussed herein in detail. Communication over the network can be enabled via wired or wireless connections and combinations thereof. In this example, the network includes the Internet, as the environment includes a Web server for receiving requests and serving content in response thereto, although for other networks, an alternative device serving a similar purpose could be used, as would be apparent to one of ordinary skill in the art.

The illustrative environment includes at least one application server and a data store. It should be understood that there can be several application servers, layers or other elements, processes or components, which may be chained or otherwise configured, which can interact to perform tasks such as obtaining data from an appropriate data store. As used herein, the term "data store" refers to any device or combination of devices capable of storing, accessing and retrieving data, which may include any combination and number of data servers, databases, data storage devices and data storage media, in any standard, distributed or clustered environment. The application server can include any appropriate hardware and software for integrating with the data store as needed to execute aspects of one or more applications for the client device and handling a majority of the data access and business logic for an application. The application server provides access control services in cooperation with the data store and is able to generate content such as text, graphics, audio and/or video to be transferred to the user, which may be served to the user by the Web server in the form of HTML, XML or another appropriate structured language in this example. The handling of all requests and responses, as well as the delivery of content between the client device and the application server, can be handled by the Web server. It should be understood that the Web and application servers are not required and are merely example components, as structured code discussed herein can be executed on any appropriate device or host machine as discussed elsewhere herein.

The data store can include several separate data tables, databases or other data storage mechanisms and media for storing data relating to a particular aspect. For example, the data store illustrated includes mechanisms for storing content (e.g., production data) and user information, which can be used to serve content for the production side. The data store is also shown to include a mechanism for storing log or session data. It should be understood that there can be many other aspects that may need to be stored in the data store, such as page image information and access rights information, which can be stored in any of the above listed mechanisms as appropriate or in additional mechanisms in the data store. The data store is operable, through logic associated therewith, to receive instructions from the application server and obtain, update or otherwise process data in response thereto. In one example, a user might submit a search request for a certain type of item. In this case, the data store might access the user information to verify the identity of the user and can access the catalog detail information to obtain information about items of that type. The information can then be returned to the user, such as in a results listing on a Web page that the user is able to view via a browser on the user device. Information for a particular item of interest can be viewed in a dedicated page or window of the browser.

Each server typically will include an operating system that provides executable program instructions for the general administration and operation of that server and typically will include computer-readable medium storing instructions that, when executed by a processor of the server, allow the server to perform its intended functions. Suitable implementations for the operating system and general functionality of the servers are known or commercially available and are readily implemented by persons having ordinary skill in the art, particularly in light of the disclosure herein.

The environment in one embodiment is a distributed computing environment utilizing several computer systems and components that are interconnected via communication links, using one or more computer networks or direct connections. However, it will be appreciated by those of ordinary skill in the art that such a system could operate equally well in a system having fewer or a greater number of components than are illustrated. Thus, the depiction of the systems herein should be taken as being illustrative in nature and not limiting to the scope of the disclosure.

The various embodiments can be further implemented in a wide variety of operating environments, which in some cases can include one or more user computers or computing devices which can be used to operate any of a number of applications. User or client devices can include any of a number of general purpose personal computers, such as desktop or laptop computers running a standard operating system, as well as cellular, wireless and handheld devices running mobile software and capable of supporting a number of networking and messaging protocols. Such a system can also include a number of workstations running any of a variety of commercially-available operating systems and other known applications for purposes such as development and database management. These devices can also include other electronic devices, such as dummy terminals, thin-clients, gaming systems and other devices capable of communicating via a network.

Most embodiments utilize at least one network that would be familiar to those skilled in the art for supporting communications using any of a variety of commercially-available protocols, such as TCP/IP, FTP, UPnP, NFS, and CIFS. The network can be, for example, a local area network, a wide-area network, a virtual private network, the Internet, an intranet, an extranet, a public switched telephone network, an infrared network, a wireless network and any combination thereof.

In embodiments utilizing a Web server, the Web server can run any of a variety of server or mid-tier applications, including HTTP servers, FTP servers, CGI servers, data servers, Java servers and business application servers. The server(s) may also be capable of executing programs or scripts in response requests from user devices, such as by executing one or more Web applications that may be implemented as one or more scripts or programs written in any programming language, such as Java®, C, C# or C++ or any scripting language, such as Perl, Python or TCL, as well as combinations thereof. The server(s) may also include database servers, including without limitation those commercially available from Oracle®, Microsoft®, Sybase® and IBM® as well as open-source servers such as MySQL, Postgres, SQLite, MongoDB, and any other server capable of storing, retrieving and accessing structured or unstructured data. Database servers may include table-based servers, document-based servers, unstructured servers, relational servers, non-relational servers or combinations of these and/or other database servers.

The environment can include a variety of data stores and other memory and storage media as discussed above. These can reside in a variety of locations, such as on a storage medium local to (and/or resident in) one or more of the computers or remote from any or all of the computers across the network. In a particular set of embodiments, the information may reside in a storage-area network (SAN) familiar to those skilled in the art. Similarly, any necessary files for performing the functions attributed to the computers, servers or other network devices may be stored locally and/or remotely, as appropriate. Where a system includes computerized devices, each such device can include hardware elements that may be electrically coupled via a bus, the elements including, for example, at least one central processing unit (CPU), at least one input device (e.g., a mouse, keyboard, controller, touch-sensitive display element or keypad) and at least one output device (e.g., a display device, printer or speaker). Such a system may also include one or more storage devices, such as disk drives, magnetic tape drives, optical storage devices and solid-state storage devices such as random access memory (RAM) or read-only memory (ROM), as well as removable media devices, memory cards, flash cards, etc.

Such devices can also include a computer-readable storage media reader, a communications device (e.g., a modem, a network card (wireless or wired), an infrared communication device) and working memory as described above. The computer-readable storage media reader can be connected with, or configured to receive, a computer-readable storage medium representing remote, local, fixed and/or removable storage devices as well as storage media for temporarily and/or more permanently containing, storing, transmitting and retrieving computer-readable information. The system and various devices also typically will include a number of software applications, modules, services or other elements located within at least one working memory device, including an operating system and application programs such as a client application or Web browser. It should be appreciated that alternate embodiments may have numerous variations from that described above. For example, customized hardware might also be used and/or particular elements might be implemented in hardware, software (including portable software, such as applets) or both. Further, connection to other computing devices such as network input/output devices may be employed.

Storage media and other non-transitory computer readable media for containing code, or portions of code, can include any appropriate media known or used in the art, such as but not limited to volatile and non-volatile, removable and non-removable media implemented in any method or technology for storage of information such as computer readable instructions, data structures, program modules or other data, including RAM, ROM, EEPROM, flash memory or other memory technology, CD-ROM, digital versatile disk (DVD) or other optical storage, magnetic cassettes, magnetic tape, magnetic disk storage or other magnetic storage devices or any other medium which can be used to store the desired information and which can be accessed by a system device. Based on the disclosure and teachings provided herein, a person of ordinary skill in the art will appreciate other ways and/or methods to implement the various embodiments.

The specification and drawings are, accordingly, to be regarded in an illustrative rather than a restrictive sense. It will, however, be evident that various modifications and changes may be made thereunto without departing from the broader spirit and scope of the invention as set forth in the claims.

What is claimed is:

1. A computing system, comprising:
   a processor;
   a non-transitory machine-readable medium having stored thereon a set of instructions, which when performed by the processor, cause the computing system to at least:
   detect a first movement behavior of a simulation agent in a first region of a spatial data structure representing a simulation environment, the first movement behavior performed using a first set of computing resources, and the first set of computing resources configured to control the first region;
   detect a second movement behavior of the simulation agent in a second region of the spatial data structure;
   allocate a second set of computing resources to perform the second movement behavior and a third movement behavior of the simulation agent in a third region of the spatial data structure, based, at least in part, on the second movement behavior and a performance criteria of the second movement behavior in the second region of the spatial data structure, the second set of computing resources having control over the second region and the third region, the second set of computing resources different from the first set of computing resources and determined, at least in part, on a cost of allocating the second set of computing resources and the performance criteria satisfying a trigger condition;
   determine a time of a future simulation event associated with at least one of the first movement behavior or the second movement behavior;
   transfer control over the second region of the spatial data structure associated with the second movement behavior of the simulation agent from the first set of computing resources to the second set of computing resources before the time of the future simulation event, with control over data assets associated with the simulation agent remaining with the first set of computing resources;
   perform the second movement behavior using the second set of computing resources;
   detect the third movement behavior;
   transfer the data assets associated with the simulation agent from the first set of computing resources to the second set of computing resources, based at least in part on the third movement behavior; and
   perform the third movement behavior using the second set of computing resources, wherein the first region, the second region, and the third region do not overlap.

2. The computing system of claim 1, wherein the set of instructions when performed further cause the computing system to:
   transfer data associated with the simulation agent from the first set of computing resources to the second set of computing resources.

3. The computing system of claim 1, wherein the set of instructions when performed further cause the computing system to:
   determine behaviors of a plurality of simulation agents in the spatial data structure;

grant control over a region of the spatial data structure associated with a first portion of the plurality of simulation agents to a first computing resource of the first set of computing resources; and transfer data assets associated with a second portion of the plurality of simulation agents from the first computing resource to a second computing resource of the second set of computing resources.

4. The computing system of claim 1, wherein at least one of the first movement behavior, the second movement behavior, or the third movement behavior is based at least in part on a simulation definition defining a velocity or path of the simulation agent in the spatial data structure.

5. A computing system, comprising:
   a processor;
   a non-transitory machine-readable medium having stored thereon a set of instructions, which when performed by the processor, cause the computing system to at least:
   determine a first movement behavior of a simulation agent in a first region of a spatial representation, the first movement behavior performed using a first set of computing resources having control over the first region;
   detect a second movement behavior of the simulation agent in a second region of the spatial representation;
   allocate a second set of computing resources to perform the second movement behavior and a third movement behavior of the simulation agent in a third region of the spatial representation, based, at least in part, on the second movement behavior and a performance criteria of the second movement behavior in the second region of the spatial representation, the second set of computing resources having control over the second region and the third region, wherein the second set of computing resources is different from the first set of computing resources and determined based, at least in part, on a cost of allocating the second set of computing resources, and the performance criteria satisfies a trigger condition;
   determine a time of a future simulation event associated with at least one of the first movement behavior or the second movement behavior;
   transfer control over the second region of the spatial representation associated with the subsequent movement behavior of the simulation agent from the first set of computing resources to the second set of computing resources before the time of the future simulation event with control over data assets associated with the simulation agent remaining with the first set of computing resources;
   perform the second movement behavior using the second set of computing resources;
   detect the third movement behavior;
   transfer the data assets associated with the simulation agent from the first set of computing resources to the second set of computing resources, based at least in part on the third movement behavior; and
   perform the third movement behavior using the second set of computing resources, wherein the first region, the second region, and the third region do not overlap.

6. The computing system of claim 5, wherein the set of instructions when performed further cause the computing system to:
   determine a first cost associated with allocation of additional computing resources and the first set of computing resources;
   determine a second cost associated with allocation of a different set of computing resources that does not include at least a portion of the first set of computing resources; and
   determine the second set of computing resources based at least in part on the first and second costs.

7. The computing system of claim 6, wherein the first and second costs include at least one of computation time, memory, load, and bandwidth.

8. The computing system of claim 5, wherein the set of instructions when performed further cause the computing system to:
   determine the second set of computing resources based at least in part on a server load associated with allocation of the second set of computing resources.

9. The computing system of claim 5, wherein the set of instructions when performed further cause the computing system to:
   transfer data associated with the simulation agent from the first set of computing resources to the second set of computing resources.

10. The computing system of claim 5, wherein the spatial representation is a simulation environment.

11. The computing system of claim 5, wherein the set of instructions when performed further cause the computing system to:
    determine movement behaviors of a plurality of simulation agents in the spatial representation;
    grant control over a region of the spatial representation associated with a first portion of the plurality of simulation agents to a first computing resource of the first set of computing resources; and
    transfer data assets associated with a second portion of the plurality of simulation agents from the first computing resource to a second computing resource of the second set of computing resources.

12. The computing system of claim 11, wherein the spatial representation comprises a spatial data structure.

13. The computing system of claim 5, wherein at least one of the first movement behavior, the second movement behavior, or the third movement behavior is based at least in part on a simulation definition.

14. The computing system of claim 13, wherein the simulation definition defines a velocity or path of the simulation agent in a respective spatial representation.

15. A computer-implemented method, comprising:
    determining a first movement behavior of a simulation agent in a first region of a spatial representation, the first movement behavior performed using a first set of computing resources controlling the first region;
    detecting a second movement behavior of the simulation agent in a second region of the spatial representation;
    allocating a second set of computing resources to perform the second movement behavior and a third movement behavior of the simulation agent in a third region of the spatial representation, based, at least in part, on the second movement behavior and a performance criteria of the second movement behavior in the second region of the spatial representation, the second set of computing resources having control over the second region and the third region, wherein the second set of computing resources is different from the first set of computing resources and determined based, at least in part, on a cost of allocating the second set of computing resources, and the performance criteria satisfies a trigger condition;

determining a time of a future simulation event associated with at least one of the first movement behavior or the second movement behavior;

transferring control over the second region of the spatial representation associated with the subsequent movement behavior of the simulation agent from the first set of computing resources to the second set of computing resources before the time of the future simulation event with control over data assets associated with the simulation agent remaining with the first set of computing resources;

performing the second movement behavior using the second set of computing resources;

detecting the third movement behavior;

transferring the data assets associated with the simulation agent from the first set of computing resources to the second set of computing resources, based at least in part on the third movement behavior; and performing the third movement behavior using the second set of computing resources, wherein the first region, the second region, and the third region do not overlap.

16. The computer-implemented method of claim 15, further comprising:

comparing the cost of allocating the second set of computing resources to a threshold or an alternate resource allocation.

17. The computer-implemented method of claim 15, further comprising:

determining behaviors of a plurality of simulation agents in the spatial representation;

granting control over a region of the spatial representation associated with a first portion of the plurality of simulation agents to a first computing resource of the first set of computing resources; and transferring data assets associated with a second portion of the plurality of simulation agents from the first computing resource to a second computing resource of the second set of computing resources.

* * * * *